United States Patent
Willcock et al.

(10) Patent No.: US 10,915,263 B2
(45) Date of Patent: *Feb. 9, 2021

(54) APPARATUSES AND METHODS FOR PARTITIONED PARALLEL DATA MOVEMENT

(71) Applicant: Micron Technology, Inc., Boise, ID (US)

(72) Inventors: Jeremiah J. Willcock, Boise, ID (US); David L. Pinney, Boise, ID (US)

(73) Assignee: Micron Technology, Inc., Boise, ID (US)

(*) Notice: Subject to any disclaimer, the term of this patent is extended or adjusted under 35 U.S.C. 154(b) by 82 days.

This patent is subject to a terminal disclaimer.

(21) Appl. No.: 16/415,714

(22) Filed: May 17, 2019

(65) Prior Publication Data

US 2019/0272114 A1 Sep. 5, 2019

Related U.S. Application Data

(63) Continuation of application No. 16/033,471, filed on Jul. 12, 2018, now Pat. No. 10,324,654, which is a (Continued)

(51) Int. Cl.
*G06F 3/06* (2006.01)
*G11C 11/4091* (2006.01)
(Continued)

(52) U.S. Cl.
CPC .......... *G06F 3/0647* (2013.01); *G06F 3/0604* (2013.01); *G06F 3/0644* (2013.01); (Continued)

(58) Field of Classification Search
CPC . G11C 11/4093; G11C 7/1048; G06F 3/0646; G06F 15/7821; G06F 3/0647
See application file for complete search history.

(56) References Cited

U.S. PATENT DOCUMENTS 4,380,046 A 4/1983 Fung
4,435,792 A 3/1984 Bechtolsheim
(Continued)

FOREIGN PATENT DOCUMENTS

CN 102141905 8/2011
EP 0214718 3/1987
(Continued)

OTHER PUBLICATIONS

Draper et al., "A Prototype Processing-In-Memory (PIM) Chip for the Data-Intensive Architecture (DIVA) System", Journal of VLSI Signal Processing Systems for Signal, Image, and Video Technology, vol. 40, Issue 1, May 1, 2005, pp. 73-84.
(Continued)

*Primary Examiner* — Jay W. Radke
(74) *Attorney, Agent, or Firm* — Brooks, Cameron & Huebsch, PLLC

(57) ABSTRACT

The present disclosure includes apparatuses and methods for partitioned parallel data movement. An example apparatus includes a memory device that includes a plurality of partitions, where each partition of the plurality of partitions includes a subset of a plurality of subarrays of memory cells. The memory device also includes sensing circuitry coupled to the plurality of subarrays, the sensing circuitry including a sense amplifier. A controller for the memory device is configured to direct a first data movement within a first partition of the plurality of partitions in parallel with a second data movement within a second partition of the plurality of partitions.

19 Claims, 7 Drawing Sheets

Related U.S. Application Data continuation of application No. 15/040,084, filed on Feb. 10, 2016, now Pat. No. 10,048,888.

(51) Int. Cl.
  *G11C 11/4093* (2006.01)
  *G06F 15/78* (2006.01)
  *G11C 7/10* (2006.01)

(52) U.S. Cl.
  CPC .......... *G06F 3/0646* (2013.01); *G06F 3/0673* (2013.01); *G06F 15/7821* (2013.01); *G11C 7/1006* (2013.01); *G11C 7/1048* (2013.01); *G11C 11/4091* (2013.01); *G11C 11/4093* (2013.01); *G11C 2207/2236* (2013.01)

(56) References Cited

U.S. PATENT DOCUMENTS

| | | |
|---|---|---|
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,040,149 A | 8/1991 | Ebihara et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffmann et al. |
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,818,785 A | 10/1998 | Ohshima |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,092,186 A | 7/2000 | Betker et al. |
| 6,122,211 A | 9/2000 | Morgan et al. |
| 6,125,071 A | 9/2000 | Kohno et al. |
| 6,130,852 A | 10/2000 | Ohtani et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,212,121 B1 | 4/2001 | Ryu et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,339,817 B1 | 1/2002 | Maesako et al. |
| 6,389,507 B1 | 5/2002 | Sherman |
| 6,418,063 B1 | 7/2002 | Seitsinger et al. |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,662,260 B1 * | 12/2003 | Wertheim .......... G06F 13/4022 710/316 |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth et al. |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,936,634 B2 | 5/2011 | Chen et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |

(56) References Cited

U.S. PATENT DOCUMENTS

| | | |
|---|---|---|
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,279,692 B2 | 10/2012 | Matsui |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,406,033 B2 | 3/2013 | Lung et al. |
| 8,417,921 B2 | 4/2013 | Gonion et al. |
| 8,462,532 B1 | 6/2013 | Argyres |
| 8,473,809 B2 | 6/2013 | Wan et al. |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,076,514 B2 | 7/2015 | Seo |
| 9,135,982 B2 | 9/2015 | Schaefer et al. |
| 9,165,023 B2 | 10/2015 | Moskovich et al. |
| 9,298,545 B2 | 3/2016 | Ratnam et al. |
| 9,607,667 B1 | 3/2017 | Lee et al. |
| 10,048,888 B2* | 8/2018 | Willcock .............. G11C 11/4093 |
| 10,324,654 B2* | 6/2019 | Willcock .............. G06F 3/0647 |
| 2001/0007112 A1 | 7/2001 | Porterfield |
| 2001/0008492 A1 | 7/2001 | Higashiho |
| 2001/0010057 A1 | 7/2001 | Yamada |
| 2001/0028584 A1 | 10/2001 | Nakayama et al. |
| 2001/0043089 A1 | 11/2001 | Forbes et al. |
| 2002/0059355 A1 | 5/2002 | Peleg et al. |
| 2003/0132457 A1 | 7/2003 | Lee et al. |
| 2003/0167426 A1 | 9/2003 | Slobodnik |
| 2003/0222879 A1 | 12/2003 | Lin et al. |
| 2004/0017691 A1 | 1/2004 | Luk et al. |
| 2004/0066671 A1 | 4/2004 | Scheuerlein et al. |
| 2004/0073592 A1 | 4/2004 | Kim et al. |
| 2004/0073773 A1 | 4/2004 | Demjanenko |
| 2004/0085835 A1 | 5/2004 | Ahn et al. |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0109904 A1 | 5/2007 | Hong et al. |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0165601 A1 | 7/2008 | Matick et al. |
| 2008/0178053 A1 | 7/2008 | Gorman et al. |
| 2008/0215937 A1 | 9/2008 | Dreibelbis et al. |
| 2008/0291760 A1 | 11/2008 | Ito et al. |
| 2009/0067218 A1 | 3/2009 | Graber |
| 2009/0154238 A1 | 6/2009 | Lee |
| 2009/0154273 A1 | 6/2009 | Borot et al. |
| 2009/0207679 A1 | 8/2009 | Takase |
| 2009/0231944 A1 | 9/2009 | Faue |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0002169 A1 | 1/2011 | Li et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134225 A1 | 5/2012 | Chow |
| 2012/0134226 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2013/0343140 A1 | 12/2013 | Sabbah |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0279466 A1 | 10/2015 | Manning |

(56) References Cited

U.S. PATENT DOCUMENTS

| | | |
|---|---|---|
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0247549 A1 | 8/2016 | Takagiwa |
| 2016/0307609 A1 | 10/2016 | Harris et al. |

FOREIGN PATENT DOCUMENTS

| | | |
|---|---|---|
| EP | 1282130 | 2/2003 |
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| TW | 201101329 | 1/2011 |
| TW | 201303595 | 1/2013 |
| TW | I454910 | 10/2014 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.

Stojmenovic, "Multiplicative Circulant Networks Topological Properties and Communication Algorithms", (25 pgs.), Discrete Applied Mathematics 77 (1997) 281-305.

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

Debnath, Biplob, Bloomflash: Bloom Filter on Flash-Based Storage, 2011 31st Annual Conference on Distributed Computing Systems, Jun. 20-24, 2011, 10 pgs.

Pagiamtzis, Kostas, "Content-Addressable Memory Introduction", Jun. 25, 2007, (6 pgs.), retrieved from: http://www.pagiamtzis.com/cam/camintro.

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

International Search Report and Written Opinion for PCT Application No. PCT/US2013/043702, dated Sep. 26, 2013, (11 pgs.).

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for related PCT Application No. PCT/US2017/016186, dated May 10, 2017, 11 pages.

\* cited by examiner

APPARATUSES AND METHODS FOR PARTITIONED PARALLEL DATA MOVEMENT

PRIORITY INFORMATION

This application is a Continuation of U.S. application Ser. No. 16/033,471, filed Jul. 12, 2018, which is a Continuation of U.S. application Ser. No. 15/040,084 filed Feb. 10, 2016, which issued as U.S. Pat. No. 10,048,888 on Aug. 14, 2018, the contents of which are included herein by reference.

TECHNICAL FIELD

The present disclosure relates generally to semiconductor memory and methods, and more particularly, to apparatuses and methods for partitioned parallel data movement.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing an operation on data (e.g., one or more operands). As used herein, an operation can be, for example, a Boolean operation, such as AND, OR, NOT, NOT, NAND, NOR, and XOR, and/or other operations (e.g., invert, shift, arithmetic, statistics, among many other possible operations). For example, functional unit circuitry may be used to perform the arithmetic operations, such as addition, subtraction, multiplication, and division on operands, via a number of logical operations.

A number of components in an electronic system may be involved in providing instructions to the functional unit circuitry for execution. The instructions may be executed, for instance, by a processing resource such as a controller and host processor. Data (e.g., the operands on which the instructions will be executed) may be stored in a memory array that is accessible by the functional unit circuitry. The instructions and data may be retrieved from the memory array and sequenced and buffered before the functional unit circuitry begins to execute instructions on the data. Furthermore, as different types of operations may be performed in one or multiple clock cycles through the functional unit circuitry, intermediate results of the instructions and data may also be sequenced and buffered.

In many instances, the processing resources (e.g., processor and associated functional unit circuitry) may be external to the memory array, and data is accessed via a bus between the processing resources and the memory array to execute a set of instructions. Processing performance may be improved in a processor-in-memory device, in which a processor may be implemented internally and near to a memory (e.g., directly on a same chip as the memory array). A processing-in-memory device may save time by reducing and eliminating external communications and may also conserve power. However, data movement between and within banks of a processing-in-memory device may influence the data processing time of the processing-in-memory device.

DETAILED DESCRIPTION

Figure 1A:
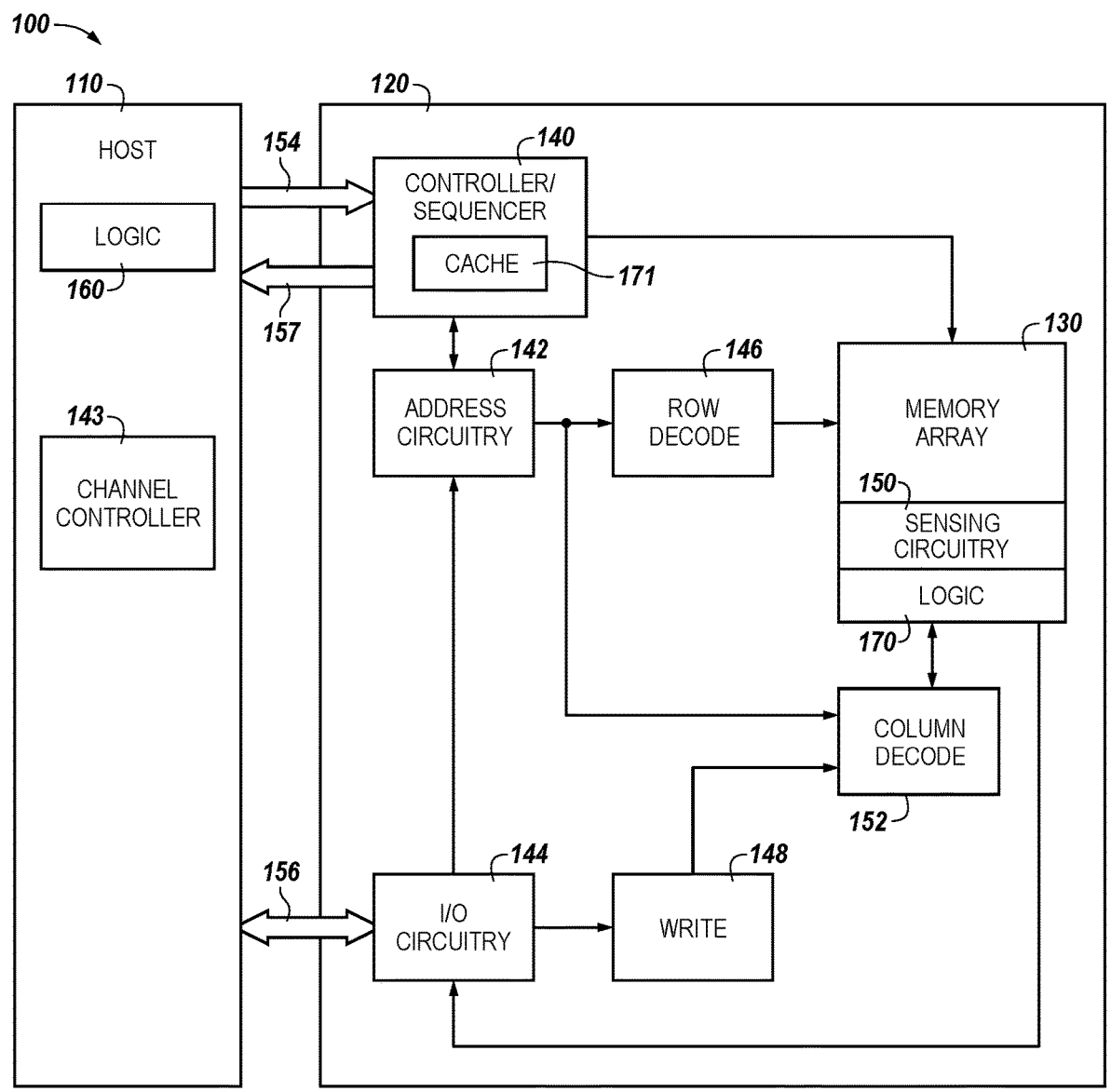
FIG. 1A is a block diagram of an apparatus in the form of a computing system including a memory device in accordance with a number of embodiments of the present disclosure.

The present disclosure includes apparatuses and methods for partitioned parallel data movement (e.g., for processing-in-memory (PIM) structures). In at least one embodiment, the apparatus includes a memory device including a plurality of partitions, where each partition of the plurality of partitions includes a subset of a plurality of subarrays of memory cells. The memory device also includes sensing circuitry coupled to the plurality of subarrays, the sensing circuitry including a sense amplifier (e.g., coupled to each of a plurality of columns). In some embodiments, the sensing circuitry also can include a compute component (e.g., coupled to a number of the plurality of columns and/or a number of a plurality of sense amplifiers). A controller of the memory device is configured to direct a first data movement within a first partition of the plurality of partitions in parallel with a second data movement within a second partition of the plurality of partitions.

For example, the controller can be configured to direct a first data movement from a first subarray to a second subarray in the first partition in parallel with a second data movement from a first subarray to a second subarray in the second partition. Ordinal numbers such as first and second are used herein to assist in distinguishing between similar components (e.g., subarrays of memory cells) and are not used to indicate a particular ordering and/or relationship between the components, unless the context clearly dictates otherwise (e.g., by using terms such as adjacent, etc.). For example, a first subarray may be subarray 4 relative to subarray 0 in a bank of subarrays and the second subarray may be any other subsequent subarray (e.g., subarray 5, subarray 8, subarray 61, among other possibilities) or the second subarray may be any other preceding subarray (e.g., subarrays 3, 2, 1, or 0). Moreover, moving data values from a first subarray to a second subarray, or from a first partition to a second partition, are provided as non-limiting examples of such data movement. For example, in some embodiments, the data values may be moved sequentially from each subarray to another (e.g., adjacent) subarray in a bank.

As described in more detail below, the embodiments can allow a host system to allocate a number of locations (e.g., sub-arrays (or "subarrays")) and portions of subarrays, in one or more DRAM banks to hold (e.g., store) and/or process data. A host system and a controller may perform the address resolution on an entire block of program instructions (e.g., PIM command instructions) and data and direct (e.g., control) allocation, storage, and/or movement (e.g., flow) of data and commands into allocated locations (e.g., subarrays and portions of subarrays) within a destination (e.g., target) bank. Writing data and executing commands (e.g., performing operations, as described herein) may utilize a normal DRAM write path to the DRAM device. As the reader will appreciate, while a DRAM-style PIM device is discussed with regard to examples presented herein, embodiments are not limited to a PIM DRAM implementation.

A bank in a memory device might include a plurality of subarrays of memory cells in which a plurality of partitions can each include a respective subset of the plurality of the subarrays. In various embodiments, an I/O line shared by a plurality of partitions (e.g., a data bus for inter-partition and/or intra-partition data movement, as described herein) can be configured to separate the plurality of subarrays into the plurality of partitions by selectably connecting and disconnecting the partitions using isolation circuitry associated with the shared I/O line to form separate portions of the shared I/O line. As such, a shared I/O line associated with isolation circuitry at a plurality of locations along its length can be used to separate the partitions of subarrays into effectively separate blocks in various combinations (e.g., numbers of subarrays in each partition, depending on whether various subarrays and/or partitions are connected via the portions of shared I/O line, etc., as directed by a controller). This can enable block data movement within individual partitions to occur substantially in parallel.

Isolation of the partitions can increase speed, rate, and/or efficiency of data movement within each partition and in a combination of a plurality of partitions (e.g., some or all the partitions) by the data movements being performed in parallel (e.g., substantially at the same point in time) in each partition or combinations of partitions. This can, for example, reduce time otherwise spent moving (e.g., transferring) data sequentially from every subarray in an array of memory cells. The parallel nature of the data movement (e.g., transfer) described herein allows for local movement of all or most of the data values in the subarrays of the partitions such that the movement may be several times faster. For example, the movement may be faster by a factor approximating the number of partitions (e.g., with four partitions, movement of all the data values in each subarray of each partition may be performed in approximately one-fourth the time taken without using the partitions described herein). In some embodiments, some but not all of the partitions may be connected to each other to enable multiple transfers, some of which may be inter-partition and/or intra-partition transfers, to be performed substantially in parallel.

By way of example, a data movement may shift data one subarray in a first direction (e.g., downward in a bank), where the bank may contain 128 subarrays. With a non-partitioned bank, this may involve 127 movements of data values from one subarray to another subarray (e.g., an adjacent subarray) being performed in sequence (plus possibly clearing the first subarray). The number of data movements, as described herein, is enumerated by the number of data movements that are not performed substantially in parallel (e.g., data movements that are performed sequentially between subarrays in the same bank, subarrays in the same partition of the bank, and/or subarrays in different partitions).

With partitioning, as described herein, the data movement operation just described can, in some embodiments, be performed in 33 coordinated movements of data values from one subarray to another subarray when the 128 subarrays are separated into four partitions (e.g., each including a respective 32 subarray subset of the 128 subarrays). For example, 31 data movements can be performed in parallel in each of four partitions when the inter-partition connections of the isolation circuitry (e.g., isolation transistors thereof) coupled to the shared I/O lines are directed (e.g., by the controller) to separate (e.g., disconnect) each of the four partitions from adjacent partitions such that the data values in each partition can be moved (e.g., transferred one subarray down) within the same partition without affecting data movements in other partitions.

Another data movement (e.g., the 32nd data movement) can be performed with the isolation circuitry between a second partition and a third partition directed to separate (e.g., disconnect) the second and third partitions and to connect a first partition to the second partition and to connect the third partition to a fourth partition in order to perform a movement of data values from the first partition to the second partition in parallel with a movement of data values from the third partition to the fourth partition.

Another data movement (e.g., the 33rd data movement) can be performed with the isolation circuitry between all of the partitions directed to connect together all of the partitions in order to perform a movement of data values from the second partition to the third partition to complete the movement of data values. Alternatively, the isolation circuitry between just the second and third partitions can be directed to connect these partitions to perform the movement of data values from the second partition to the third partition.

The parallelism achieved through the partitioning just described may enable the time taken to complete the data movement operation to be reduced by approximately 74% (e.g., 1.0-33/127=0.740), even though some of the data movements may involve movement between separate partitions. As described further herein, when the data movement is in-place (e.g., overwriting preexisting data saved in a row of a subarray with data moved from a row of another subarray), there may be operations performed to save the data values of various subarrays (e.g., data values stored in a row or rows of a last subarray in a partition) prior to being overwritten to enable these data values to be later moved (e.g., transferred) between the different partitions. For example, saving the data values as such can be performed to enable the 32nd and 33rd data movements just described. However, those operations may not have a major effect on the total number of data movements and/or the length of time taken for the data movement operation.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and structural changes may be made without departing from the scope of the present disclosure.

As used herein, designators such as "X", "Y", "N", "M", etc., particularly with respect to reference numerals in the drawings, indicate that a number of the particular feature so designated can be included. It is also to be understood that the terminology used herein is for the purpose of describing particular embodiments only, and is not intended to be limiting. As used herein, the singular forms "a", "an", and "the" can include both singular and plural referents, unless the context clearly dictates otherwise. In addition, "a number of", "at least one", and "one or more" (e.g., a number of memory arrays) can refer to one or more memory arrays, whereas a "plurality of" is intended to refer to more than one of such things. Furthermore, the words "can" and "may" are used throughout this application in a permissive sense (i.e., having the potential to, being able to), not in a mandatory sense (i.e., must). The term "include," and derivations thereof, means "including, but not limited to". The terms "coupled" and "coupling" mean to be directly or indirectly connected physically or for access to and movement (transmission) of commands and data, as appropriate to the context. The terms "data" and "data values" are used interchangeably herein and can have the same meaning, as appropriate to the context.

The figures herein follow a numbering convention in which the first digit or digits correspond to the figure number and the remaining digits identify an element or component in the figure. Similar elements or components between different figures may be identified by the use of similar digits. For example, 108 may reference element "08" in FIG. 1, and a similar element may be referenced as 208 in FIG. 2. As will be appreciated, elements shown in the various embodiments herein can be added, exchanged, and eliminated so as to provide a number of additional embodiments of the present disclosure. In addition, the proportion and the relative scale of the elements provided in the figures are intended to illustrate certain embodiments of the present disclosure and should not be taken in a limiting sense.

FIG. 1A is a block diagram of an apparatus in the form of a computing system 100 including a memory device 120 in accordance with a number of embodiments of the present disclosure. As used herein, a memory device 120, controller 140, channel controller 143, memory array 130, sensing circuitry 150, including sensing amplifiers and compute circuitry, and peripheral sense amplifier and logic 170 might each also be separately considered an "apparatus."

In previous approaches, data may be transferred from the array and sensing circuitry (e.g., via a bus comprising input/output (I/O) lines) to a processing resource such as a processor, microprocessor, and compute engine, which may comprise ALU circuitry and other functional unit circuitry configured to perform the appropriate operations. However, transferring data from a memory array and sensing circuitry to such processing resource(s) may involve significant power consumption. Even if the processing resource is located on a same chip as the memory array, significant power can be consumed in moving data out of the array to the compute circuitry, which can involve performing a sense line (which may be referred to herein as a digit line or data line) address access (e.g., firing of a column decode signal) in order to transfer data from sense lines onto I/O lines (e.g., local and global I/O lines), moving the data to the array periphery, and providing the data to the compute function.

Furthermore, the circuitry of the processing resource(s) (e.g., a compute engine) may not conform to pitch rules associated with a memory array. For example, the cells of a memory array may have a $4F^2$ or $6F^2$ cell size, where "F" is a feature size corresponding to the cells. As such, the devices (e.g., logic gates) associated with ALU circuitry of previous PIM systems may not be capable of being formed on pitch with the memory cells, which can affect chip size and memory density, for example.

A number of embodiments of the present disclosure include sensing circuitry formed on pitch with an array of memory cells. The sensing circuitry is capable of performing data sensing and compute functions and storage (e.g., caching) of data local to the array of memory cells.

In order to appreciate the improved data movement (e.g., transfer) techniques described herein, a discussion of an apparatus for implementing such techniques (e.g., a memory device having PIM capabilities and an associated host) follows. According to various embodiments, program instructions (e.g., PIM commands) involving a memory device having PIM capabilities can distribute implementation of the PIM commands and data over multiple sensing circuitries that can implement operations and can move and store the PIM commands and data within the memory array (e.g., without having to transfer such back and forth over an A/C and data bus between a host and the memory device). Thus, data for a memory device having PIM capabilities can be accessed and used in less time and using less power. For example, a time and power advantage can be realized by increasing the speed, rate, and/or efficiency of data being moved around and stored in a computing system in order to process requested memory array operations (e.g., reads, writes, logical operations, etc.).

The system 100 illustrated in FIG. 1A can include a host 110 coupled (e.g., connected) to memory device 120, which includes the memory array 130. Host 110 can be a host system such as a personal laptop computer, a desktop computer, a tablet computer, a digital camera, a smart phone, or a memory card reader, among various other types of hosts. Host 110 can include a system motherboard and backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system or a portion of either. Although the example shown in FIG. 1A illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, description of the system 100 has been simplified to focus on features with particular relevance to the present disclosure. For example, in various embodiments, the memory array 130 can be a DRAM array, SRAM array, STT RAM array, PCRAM array, TRAM array, RRAM array, NAND flash array, and NOR flash array, for instance. The memory array 130 can include memory cells arranged in rows coupled by access lines (which may be referred to herein as word lines or select lines) and columns coupled by sense lines (which may be referred to herein as data lines or digit lines). Although a single memory array 130 is shown in FIG. 1A, embodiments are not so limited. For instance, memory device 120 may include a number of memory arrays 130 (e.g., a number of banks of DRAM cells, NAND flash cells, etc.) in addition to a number subarrays, as described herein.

The memory device 120 can include address circuitry 142 to latch address signals provided over a data bus 156 (e.g., an I/O bus from the host 110) by I/O circuitry 144 (e.g., provided to external ALU circuitry and to DRAM DQs via local I/O lines and global I/O lines). As used herein, DRAM DQs can enable input of data to and output of data from a bank (e.g., from and to the controller 140 and/or host 110) via a bus (e.g., data bus 156). During a write operation, a voltage (high=1, low=0) can be applied to a DQ (e.g., a pin). This voltage can be translated into an appropriate signal and stored in a selected memory cell. During a read operation, a data value read from a selected memory cell can appear at the DQ once access is complete and the output is enabled (e.g., by the output enable signal being low). At other times, DQs can be in a high impedance state, such that the DQs do not source or sink current and do not present a signal to the system. This also may reduce DQ contention when two or more devices (e.g., banks) share the data bus.

Status and exception information can be provided from the controller 140 on the memory device 120 to a channel controller 143, for example, through a high speed interface (HSI) out-of-band bus 157, which in turn can be provided from the channel controller 143 to the host 110. The channel controller 143 can include a logic component 160 to allocate a plurality of locations (e.g., controllers for subarrays) in the arrays of each respective bank to store bank commands, application instructions (e.g., as sequences of operations), and arguments (PIM commands) for the various banks associated with operation of each of a plurality of memory devices (e.g., 120-0, 120-1, . . . , 120-N). The channel controller 143 can dispatch commands (e.g., PIM commands) to the plurality of memory devices 120-1, . . . , 120-N to store those program instructions within a given bank of a memory device.

Address signals are received through address circuitry 142 and decoded by a row decoder 146 and a column decoder 152 to access the memory array 130. Data can be sensed (read) from memory array 130 by sensing voltage and current changes on sense lines (digit lines) using a number of sense amplifiers, as described herein, of the sensing circuitry 150. A sense amplifier can read and latch a page (e.g., a row) of data from the memory array 130. Additional compute components, as described herein, can be coupled to the sense amplifiers and can be used in combination with the sense amplifiers to sense, store (e.g., cache and buffer), perform compute functions (e.g., operations), and/or move data. The I/O circuitry 144 can be used for bi-directional data communication with host 110 over the data bus 156 (e.g., a 64 bit wide data bus). The write circuitry 148 can be used to write data to the memory array 130.

Controller 140 (e.g., bank control logic and sequencer) can decode signals (e.g., commands) provided by control bus 154 from the host 110. These signals can include chip enable signals, write enable signals, and address latch signals that can be used to control operations performed on the memory array 130, including data sense, data store, data movement, data write, and data erase operations, among other operations. In various embodiments, the controller 140 can be responsible for executing instructions from the host 110 and accessing the memory array 130. The controller 140 can be a state machine, a sequencer, or some other type of controller. The controller 140 can control shifting data (e.g., right or left) in a row of an array (e.g., memory array 130).

Examples of the sensing circuitry 150 are described further below (e.g., in FIGS. 2 and 3). For instance, in a number of embodiments, the sensing circuitry 150 can include a number of sense amplifiers and a number of compute components, which may serve as an accumulator and can be used to perform operations as directed by a controller 140 and/or a respective subarray controller (not shown) of each subarray (e.g., on data associated with complementary sense lines).

In a number of embodiments, the sensing circuitry 150 can be used to perform operations using data stored in memory array 130 as inputs and participate in movement of the data for transfer, writing, logic, and storage operations to a different location in the memory array 130 without transferring the data via a sense line address access (e.g., without firing a column decode signal). As such, various compute functions can be performed using, and within, sensing circuitry 150 rather than (or in association with) being performed by processing resources external to the sensing circuitry 150 (e.g., by a processor associated with host 110 and other processing circuitry, such as ALU circuitry, located on device 120, such as on controller 140 or elsewhere).

In various previous approaches, data associated with an operand, for instance, would be read from memory via sensing circuitry and provided to external ALU circuitry via I/O lines (e.g., via local I/O lines and global I/O lines). The external ALU circuitry could include a number of registers and would perform compute functions using the operands, and the result would be transferred back to the array via the I/O lines.

In contrast, in a number of embodiments of the present disclosure, sensing circuitry 150 is configured to perform operations on data stored in memory array 130 and store the result back to the memory array 130 without enabling a local I/O line and global I/O line coupled to the sensing circuitry 150. The sensing circuitry 150 can be formed on pitch with the memory cells of the array. Additional peripheral sense amplifiers and/or logic 170 (e.g., subarray controllers that each execute instructions for performing a respective operation) can be coupled to the sensing circuitry 150. The sensing circuitry 150 and the peripheral sense amplifier and logic 170 can cooperate in performing operations, according to some embodiments described herein.

As such, in a number of embodiments, circuitry external to memory array 130 and sensing circuitry 150 is not needed to perform compute functions as the sensing circuitry 150 can perform the appropriate operations in order to perform such compute functions in a sequence of instructions without the use of an external processing resource. Therefore, the sensing circuitry 150 may be used to complement or to replace, at least to some extent, such an external processing resource (or at least the bandwidth consumption of such an external processing resource).

In a number of embodiments, the sensing circuitry 150 may be used to perform operations (e.g., to execute a sequence of instructions) in addition to operations performed by an external processing resource (e.g., host 110). For instance, either of the host 110 and the sensing circuitry 150 may be limited to performing only certain operations and a certain number of operations.

Enabling a local I/O line and global I/O line can include enabling (e.g., turning on, activating) a transistor having a gate coupled to a decode signal (e.g., a column decode signal) and a source/drain coupled to the I/O line. However, embodiments are not limited to not enabling a local I/O line and global I/O line. For instance, in a number of embodiments, the sensing circuitry 150 can be used to perform operations without enabling column decode lines of the array. However, the local I/O line(s) and global I/O line(s) may be enabled in order to transfer a result to a suitable location other than back to the memory array 130 (e.g., to an external register).

Figure 1B:
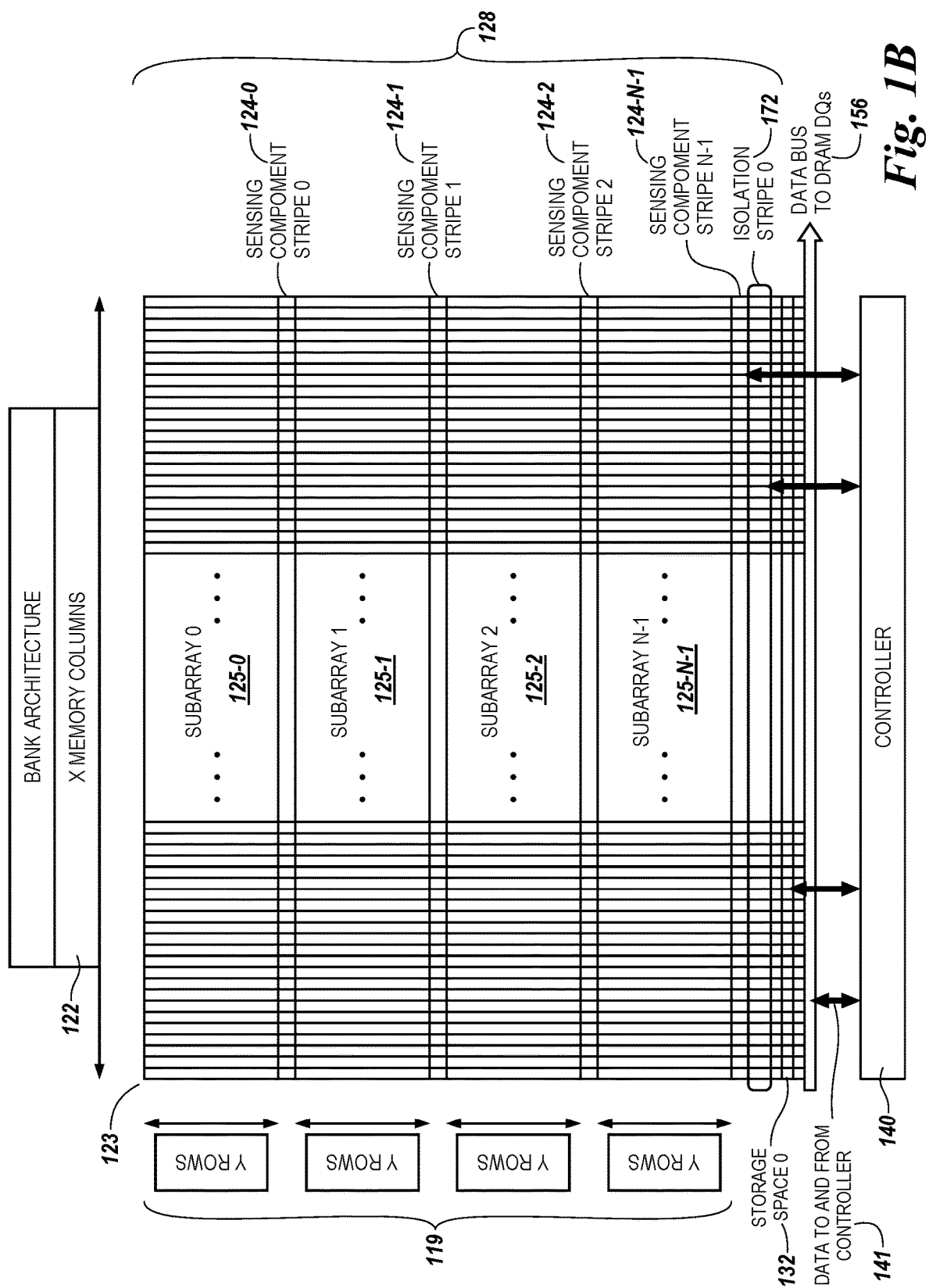
FIG. 1B is a block diagram of a bank section of a memory device in accordance with a number of embodiments of the present disclosure.

FIG. 1B is a block diagram of a bank section 123 of a memory device in accordance with a number of embodiments of the present disclosure. Bank section 123 can represent an example section of a number of bank sections of a bank of a memory device (e.g., bank section 0, bank section 1, . . . , bank section M). As shown in FIG. 1B, a bank section 123 can include a plurality of memory columns 122 shown horizontally as X (e.g., 16,384 columns in an example DRAM bank and bank section). Additionally, the bank section 123 may be divided into subarray 0, subarray 1, . . . , and subarray N−1 (e.g., 32, 64, 128, or various uneven numbers of subarrays) shown at 125-0, 125-1, . . . , 125-N−1, respectively, that are separated by amplification regions configured to be coupled to a data path (e.g., the shared I/O line described herein). As such, the subarrays 125-0, 125-1, . . . , 125-N−1 can each have amplification regions shown 124-0, 124-1, . . . , 124-N−1 that correspond to sensing component stripe 0, sensing component stripe 1, . . . , and sensing component stripe N−1, respectively.

Each column 122 is configured to be coupled to sensing circuitry 150, as described in connection with FIG. 1A and elsewhere herein. As such, each column in a subarray can, in some embodiments, be coupled individually to a sense amplifier and compute component that contribute to a sensing component stripe for that subarray. For example, as shown in FIG. 1B, the bank section 123 can include sensing component stripe 0, sensing component stripe 1, . . . , sensing component stripe N−1 that each have sensing circuitry 150 with sense amplifiers and compute components that can, in various embodiments, be used as registers, cache, and data buffering, etc., and that are coupled to each column 122 in the subarrays 125-0, 125-1, . . . , 125-N−1. The compute component within the sensing circuitry 150 coupled to the memory array 130, as shown in FIG. 1A, can complement a cache 171 associated with the controller 140.

Each of the of the subarrays 125-0, 125-1, . . . , 125-N−1 can include a plurality of rows 119 shown vertically as Y (e.g., each subarray may include 512 rows in an example DRAM bank). Example embodiments are not limited to the example horizontal and vertical orientation of columns and rows described herein or the example numbers thereof.

Figure 1C:
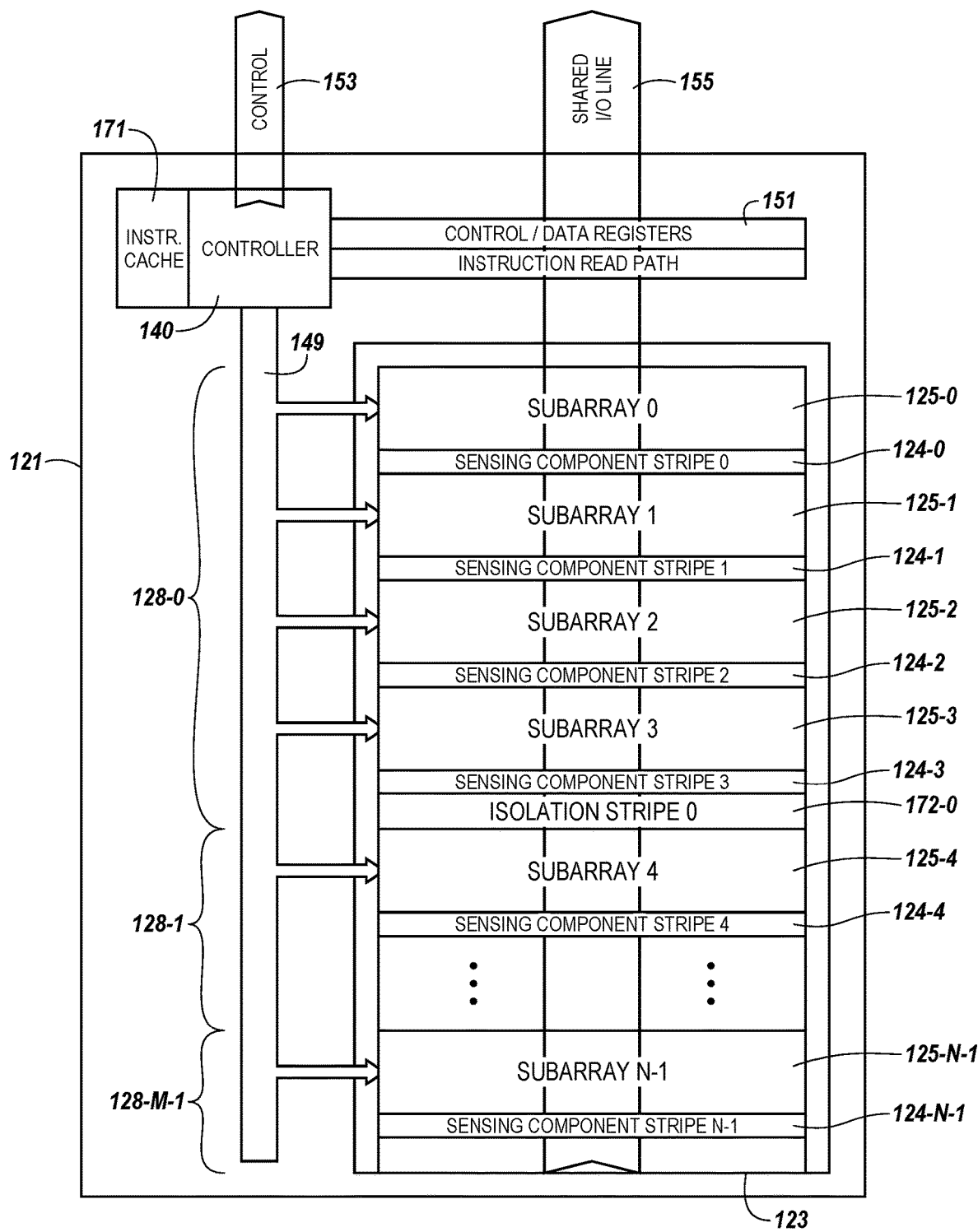
FIG. 1C is a block diagram of a bank of a memory device in accordance with a number of embodiments of the present disclosure.

An isolation stripe (e.g., isolation stripe 172) can be associated with a partition 128 of a plurality of subarrays. For example, isolation stripe 0 (172) is shown by way of example to be adjacent sensing component stripe 124-N−1, which is coupled to subarray 125-N−1. In some embodiments, subarray 125-N−1 may be subarray 32 in a stack of 128 subarrays and may be a last subarray in a first direction in a first partition of four partitions of subarrays, as described herein. As described further in connection with FIGS. 1C and 3, isolation stripes can include a number of isolation transistors configured to selectably (e.g., as directed by controller 140) connect and disconnect portions of a selected shared I/O line. Selectably enabling (e.g., activating and inactivating) the isolation transistors connects and disconnects movement between partitions via the shared I/O line of data values to and from the sense amplifiers and/or compute components (e.g., in sensing component stripes, as described herein).

FIG. 1B schematically illustrates storage space (e.g., storage space 132) that can be configured for storage of data values from various subarrays (e.g., data values from some or all rows of a last subarray in a partition) prior to being overwritten to enable these data values to be later moved (e.g., transferred) between the different partitions, as described herein. For example, the data values from a row or rows of the last subarray in the partition can be moved (e.g., transferred) to an unused (e.g., designated) row or rows of memory cells in the same partition or in a different partition and/or subarray (e.g., shifted into a different partition and/or subarray), and/or any other available storage space associated with the array in order to serve as the storage space. In various embodiments, the data values moved to the storage space may be stored indefinitely or may be stored temporarily (e.g., until moved to another partition). The data values that are stored in the storage space 132, however, remain associated with the source subarray and source partition such that the data values are movable (e.g., transferable) to a destination subarray in another partition by connection of the two partitions. As described herein, the two partitions can be connected (e.g., as directed by controller 140) via the isolation transistors in the isolation stripe 172 between the two partitions.

As such, the plurality of subarrays 125-0, 125-1, . . . , 125-N−1, the plurality of sensing component stripes 124-0, 124-1, . . . , 124-N−1, and the isolation stripe 172 may be considered as a single partition 128. In some embodiments, however, depending upon the direction of the data movement, an isolation stripe can be shared by two adjacent partitions. As just described, the storage space 132 may at least be associated with partition 128 even if not physically integrated into the partition 128.

As shown in FIG. 1B, the bank section 123 can be associated with controller 140. The controller 140 shown in FIG. 1B can, in various examples, represent at least a portion of the functionality embodied by and contained in the controller 140 shown in FIG. 1A. The controller 140 can direct (e.g., control) input of commands and data 141 to the bank section 123 and output of data from the bank section 123 (e.g., to the host 110) along with control of data movements in the bank section 123, as described herein. The bank section 123 can include a data bus 156 (e.g., a 64 bit wide data bus) to DRAM DQs, which can correspond to the data bus 156 described in connection with FIG. 1A.

FIG. 1C is a block diagram of a bank 121 of a memory device in accordance with a number of embodiments of the present disclosure. Bank 121 can represent an example bank of a memory device (e.g., bank 0, bank 1, . . . , bank M−1). As shown in FIG. 1C, a bank 121 can include an address/control (A/C) path 153 (e.g., a bus) coupled to a controller 140. Again, the controller 140 shown in FIG. 1C can, in various examples, represent at least a portion of the functionality embodied by and contained in the controller 140 shown in FIGS. 1A and 1B.

As shown in FIG. 1C, a bank 121 can include a plurality of bank sections (e.g., bank section 123). As further shown in FIG. 1C, a bank section 123 can be subdivided into a plurality of subarrays (e.g., subarray 0, subarray 1, . . . , subarray N−1 shown at 125-1, 125-2, . . . , 125-N−1) respectively separated by sensing component stripes 124-0, 124-1, . . . , 124-N−1 that include sensing circuitry 150 and logic circuitry 170. As noted, the sensing component stripes 124-0, 124-1, . . . , 124-N−1 each include sensing circuitry 150, having sense amplifiers and compute components and logic 170 configured to couple to each column of memory cells in each subarray, as shown in FIG. 1A and described further in connection with FIGS. 2, 3, 4A, and 4B. The subarrays and associated sensing component stripes can be divided into a number of partitions (e.g., 128-0, 128-1, . . . , 128-M−1) that share an I/O line 155, as described further herein.

As shown schematically in FIG. 1C, a bank 121 and each section 123 of the bank can include a shared I/O line 155 as a data path (e.g., bus) coupled to a plurality of control/data registers in an instruction and/or data (e.g., program instructions (PIM commands) read path and coupled to a plurality of bank sections (e.g., bank section 123) in a particular bank 121. The controller 140 can be configured to receive a command to start performance of an operation in a given bank (e.g., bank 121-1). The controller 140 may be configured to retrieve instructions and/or constant data (e.g., using shared I/O line 155 coupled to control and data registers 151) from the plurality of locations for the particular bank and perform an operation using the compute component of the sensing circuitry 150. The controller 140 may cache retrieved instructions and/or constant data local to the particular bank (e.g., in instruction cache 171 and/or logic circuitry 170).

As described herein, an I/O line can be selectably shared by a plurality of partitions, subarrays, rows, and particular columns of memory cells via the sensing component stripe coupled to each of the subarrays. For example, the sense amplifier and/or compute component of each of a selectable subset of a number of columns (e.g., eight column subsets of a total number of columns) can be selectably coupled to each of the plurality of shared I/O lines for data values stored (cached) in the sensing component stripe to be moved (e.g., transferred, transported, and/or fed) to each of the plurality of shared I/O lines. Because the singular forms "a", "an", and "the" can include both singular and plural referents herein, "a shared I/O line" can be used to refer to "a plurality of shared I/O lines", unless the context clearly dictates otherwise. Moreover, "shared I/O lines" is an abbreviation of "plurality of shared I/O lines".

In some embodiments, the controller 140 may be configured to provide instructions (commands) and data to a plurality of locations of a particular bank 121 in the memory array 130 and to the sensing component stripes 124-0, 124-1, . . . , 124-N−1 via the shared I/O line 155 coupled to control and data registers 151. For example, the control and data registers 151 can provide instructions to be executed by the sense amplifiers and the compute components of the sensing circuitry 150 in the sensing component stripes 124-0, 124-1, . . . , 124-N−1. FIG. 1C illustrates the instruction cache 171 associated with the controller 140 and coupled to a write path 149 to each of the subarrays 125-0, . . . , 125-N−1 in the bank 121.

Implementations of PIM DRAM architecture may perform processing at the sense amplifier and compute component level. Implementations of PIM DRAM architecture may allow a finite number of memory cells to be connected to each sense amplifier (e.g., around 512 memory cells in some embodiments). A sensing component stripe 124 may include, for example, from around 8,000 to around 16,000 sense amplifiers. A sensing component stripe 124 may be configured to couple to an array of, for example, 512 rows and around 16,000 columns. A sensing component stripe can be used as a building block to construct the larger memory. In an array for a memory device, there may be, for example, 32, 64, or 128 sensing component stripes, which correspond to 32, 64, or 128 subarrays, as described herein. Hence, for example, 512 rows times 128 sensing component stripes would yield around 66,000 rows intersected by around 16,000 columns to form around a 1 gigabit DRAM. As such, compared to other PIM DRAM implementations, utilization of the structures and processes described herein may save time for data processing (e.g., by reducing external communications by not having to read data out of one bank, bank section, and subarray thereof, storing the data, and then writing the data in another location) and may also conserve power.

As described in connection with FIG. 1B, a plurality of subarrays (e.g., the four subarrays 125-0, 125-1, 125-2, and 125-3 shown by way of example in FIG. 1C) and their respective sensing component stripes can, in association with a first isolation stripe 0 (172-0), constitute a first partition 128-0. The isolation stripe 172-0 can be positioned in between subarray 3 (125-3) and subarray 4 (125-4) such that subarray 125-3 is a last subarray in a first direction (e.g., downward in the context of FIG. 1C) of the first partition 128-0 and subarray 125-4 is a first subarray in the first direction of a second partition 128-1. A number of subarrays and their respective sensing component stripes can extend further in the first direction until a second isolation stripe (not shown) is positioned between the second partition 128-1 and a first subarray 125-N−1 of a third partition 128-M−1.

Embodiments, however, are not so limited. For example, in various embodiments, there can be any number of subarrays in the bank section 123, which can be separated by isolation stripes into any number of partitions. In various embodiments, the partitions can each include a same number or a different number of subarrays, sensing component stripes, storage spaces, etc., depending on the implementation.

Figure 2:
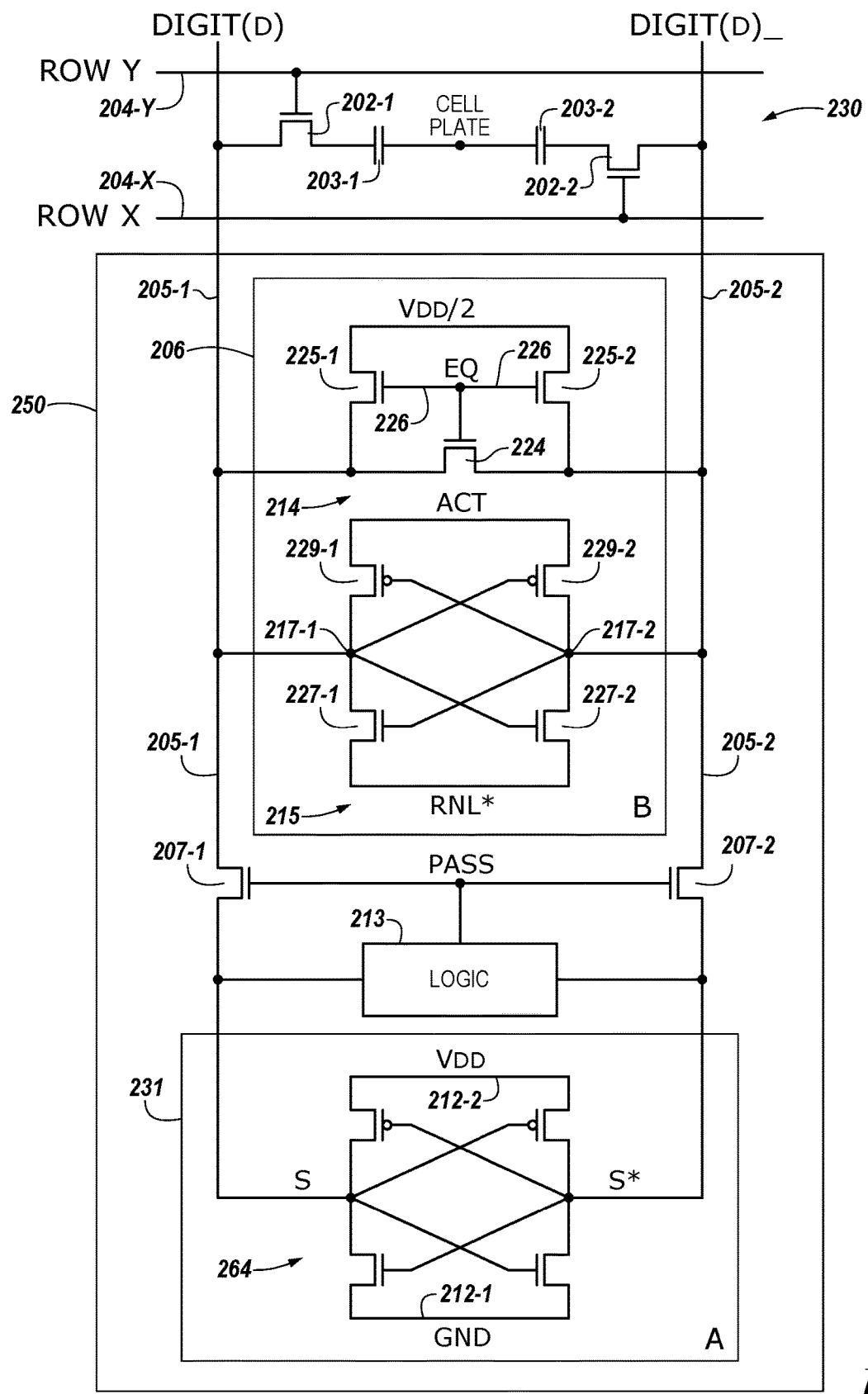
FIG. 2 is a schematic diagram illustrating sensing circuitry to a memory device in accordance with a number of embodiments of the present disclosure.

FIG. 2 is a schematic diagram illustrating sensing circuitry 250 in accordance with a number of embodiments of the present disclosure. The sensing circuitry 250 can correspond to sensing circuitry 150 shown in FIG. 1A.

A memory cell can include a storage element (e.g., capacitor) and an access device (e.g., transistor). For instance, a first memory cell can include transistor 202-1 and capacitor 203-1, and a second memory cell can include transistor 202-2 and capacitor 203-2, etc. In this embodiment, the memory array 230 is a DRAM array of 1T1C (one transistor one capacitor) memory cells, although other embodiments of configurations can be used (e.g., 2T2C with two transistors and two capacitors per memory cell). In a number of embodiments, the memory cells may be destructive read memory cells (e.g., reading the data stored in the cell destroys the data such that the data originally stored in the cell is refreshed after being read).

Figure 3:
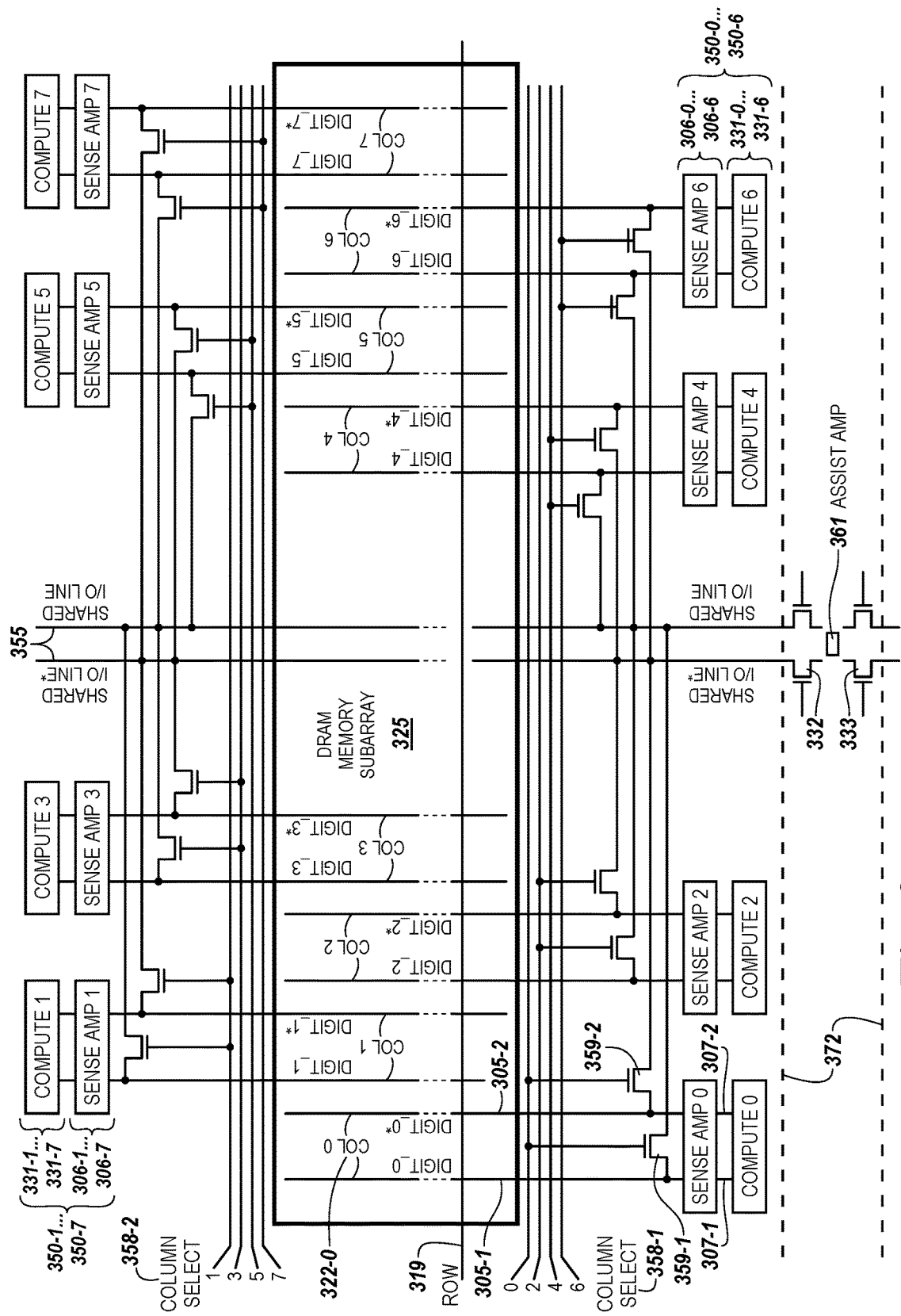
FIG. 3 is a schematic diagram illustrating circuitry for data movement in a memory device in accordance with a number of embodiments of the present disclosure.
Figure 4A:
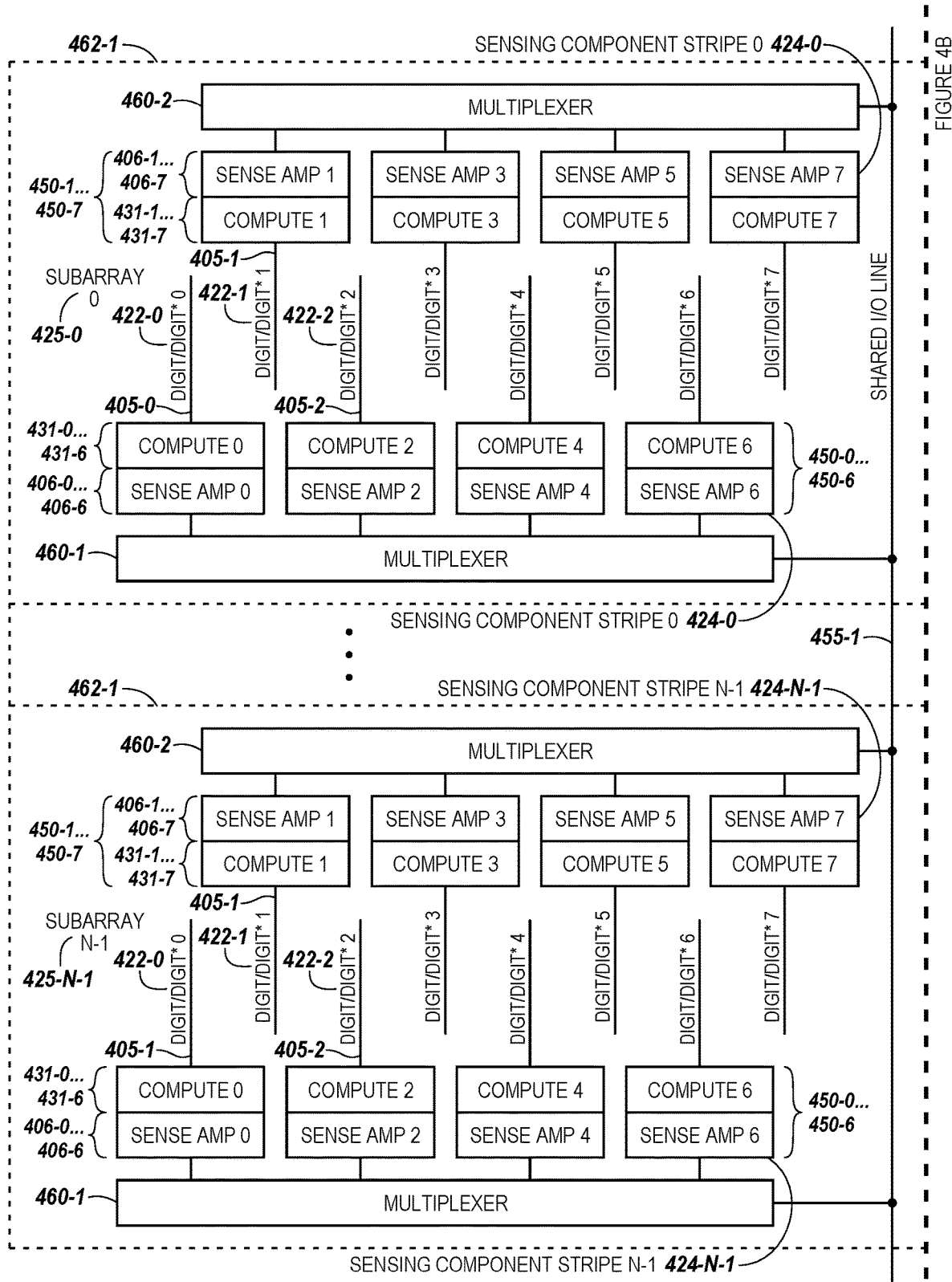
FIGS. 4A and 4B are another schematic diagram illustrating circuitry for data movement in a memory device in accordance with a number of embodiments of the present disclosure.
Figure 4B:
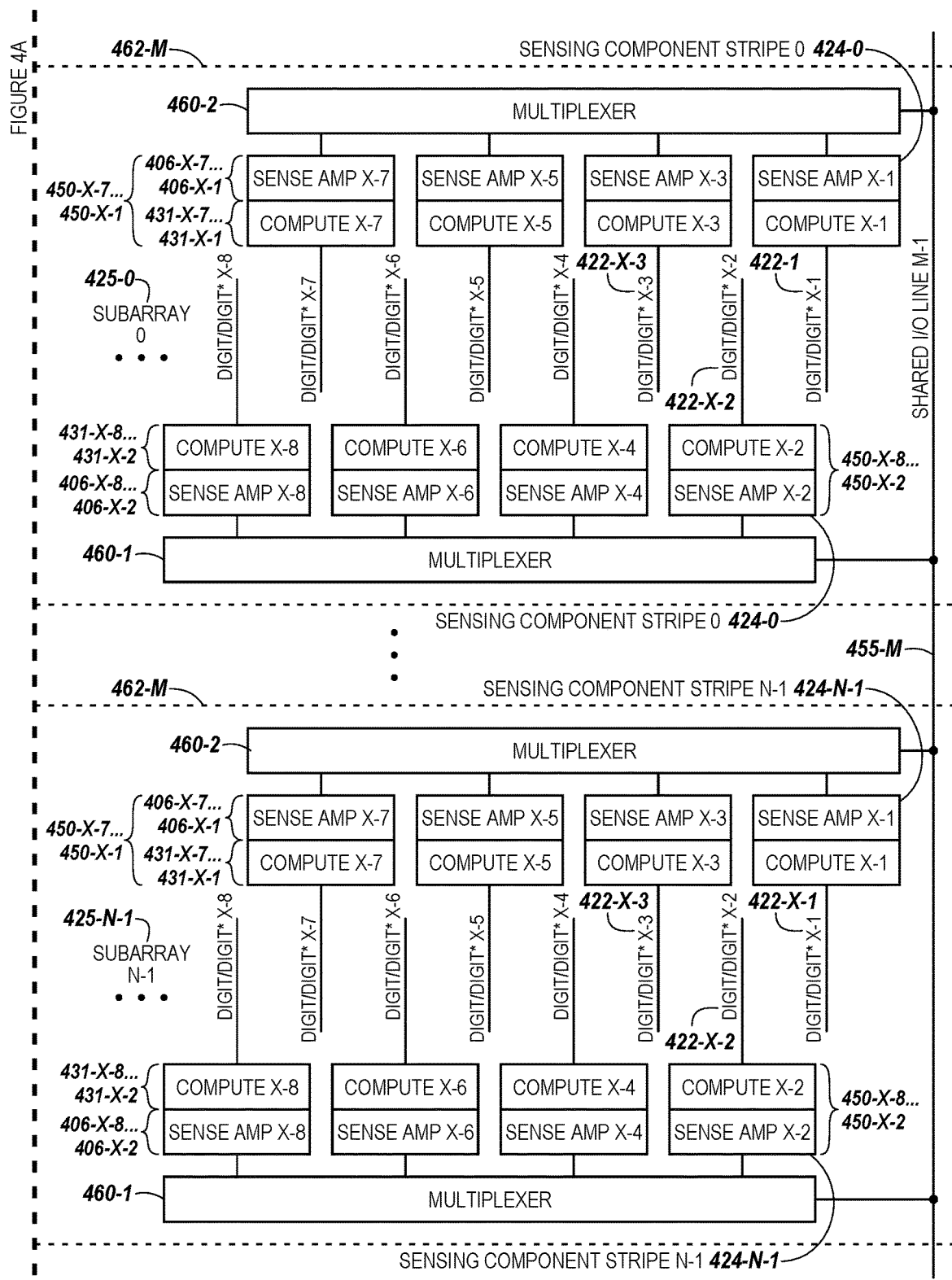

The cells of the memory array 230 can be arranged in rows coupled by access (word) lines 204-X (Row X), 204-Y (Row Y), etc., and columns coupled by pairs of complementary sense lines (e.g., digit lines DIGIT(D) and DIGIT (D)_ shown in FIG. 2 and DIGIT_0 and DIGIT_0* shown in FIGS. 3 and 4A-4B). The individual sense lines corresponding to each pair of complementary sense lines can also be referred to as digit lines 205-1 for DIGIT (D) and 205-2 for DIGIT (D)_, respectively, or corresponding reference numbers in FIGS. 3 and 4A-4B. Although only one pair of complementary digit lines are shown in FIG. 2, embodiments of the present disclosure are not so limited, and an array of memory cells can include additional columns of memory cells and digit lines (e.g., 4,096, 8,192, 16,384, etc.).

Although rows and columns are illustrated as orthogonally oriented in a plane, embodiments are not so limited. For example, the rows and columns may be oriented relative to each other in any feasible three-dimensional configuration. The rows and columns may be oriented at any angle relative to each other, may be oriented in a substantially horizontal plane or a substantially vertical plane, and/or may be oriented in a folded topology, among other possible three-dimensional configurations.

Memory cells can be coupled to different digit lines and word lines. For example, a first source/drain region of a transistor 202-1 can be coupled to digit line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to digit line 205-2 (D)_, a second source/drain region of transistor 202-2 can be coupled to capacitor 203-2, and a gate of a transistor 202-2 can be coupled to word line 204-X. A cell plate, as shown in FIG. 2, can be coupled to each of capacitors 203-1 and 203-2. The cell plate can be a common node to which a reference voltage (e.g., ground) can be applied in various memory array configurations.

The memory array 230 is configured to couple to sensing circuitry 250 in accordance with a number of embodiments of the present disclosure. In this embodiment, the sensing circuitry 250 comprises a sense amplifier 206 and a compute component 231 corresponding to respective columns of memory cells (e.g., coupled to respective pairs of complementary digit lines). The sense amplifier 206 can be coupled to the pair of complementary digit lines 205-1 and 205-2. The compute component 231 can be coupled to the sense amplifier 206 via pass gates 207-1 and 207-2. The gates of the pass gates 207-1 and 207-2 can be coupled to operation selection logic 213.

The operation selection logic 213 can be configured to include pass gate logic for controlling pass gates that couple the pair of complementary digit lines un-transposed between the sense amplifier 206 and the compute component 231 and swap gate logic for controlling swap gates that couple the pair of complementary digit lines transposed between the sense amplifier 206 and the compute component 231. The operation selection logic 213 can also be coupled to the pair of complementary digit lines 205-1 and 205-2. The operation selection logic 213 can be configured to control continuity of pass gates 207-1 and 207-2 based on a selected operation.

The sense amplifier 206 can be operated to determine a data value (e.g., logic state) stored in a selected memory cell. The sense amplifier 206 can comprise a cross coupled latch, which can be referred to herein as a primary latch. In the example illustrated in FIG. 2, the circuitry corresponding to sense amplifier 206 comprises a latch 215 including four transistors coupled to a pair of complementary digit lines D 205-1 and (D)_205-2. However, embodiments are not limited to this example. The latch 215 can be a cross coupled latch, e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2). The cross coupled latch 215 comprising transistors 227-1, 227-2, 229-1, and 229-2 can be referred to as a primary latch.

In operation, when a memory cell is being sensed (e.g., read), the voltage on one of the digit lines 205-1 (D) or 205-2 (D)_ will be slightly greater than the voltage on the other one of digit lines 205-1 (D) or 205-2 (D)_. An ACT signal and an RNL* signal can be driven low to enable (e.g., fire) the sense amplifier 206. The digit lines 205-1 (D) or 205-2 (D)_ having the lower voltage will turn on one of the PMOS transistor 229-1 or 229-2 to a greater extent than the other of PMOS transistor 229-1 or 229-2, thereby driving high the digit line 205-1 (D) or 205-2 (D)_ having the higher voltage to a greater extent than the other digit line 205-1 (D) or 205-2 (D)_ is driven high.

Similarly, the digit line 205-1 (D) or 205-2 (D)_ having the higher voltage will turn on one of the NMOS transistor 227-1 or 227-2 to a greater extent than the other of the NMOS transistor 227-1 or 227-2, thereby driving low the digit line 205-1 (D) or 205-2 (D)_ having the lower voltage to a greater extent than the other digit line 205-1 (D) or 205-2 (D)_ is driven low. As a result, after a short delay, the digit line 205-1 (D) or 205-2 (D)_ having the slightly greater voltage is driven to the voltage of the supply voltage Vcc through a source transistor, and the other digit line 205-1 (D) or 205-2 (D)_ is driven to the voltage of the reference voltage (e.g., ground) through a sink transistor. Therefore, the cross coupled NMOS transistors 227-1 and 227-2 and PMOS transistors 229-1 and 229-2 serve as a sense amplifier pair, which amplify the differential voltage on the digit lines 205-1 (D) and 205-2 (D)_ and operate to latch a data value sensed from the selected memory cell. As used herein, the cross coupled latch of sense amplifier 206 may be referred to as a primary latch 215.

Embodiments are not limited to the sense amplifier 206 configuration illustrated in FIG. 2. As an example, the sense amplifier 206 can be a current-mode sense amplifier and a single-ended sense amplifier (e.g., sense amplifier coupled to one digit line). Also, embodiments of the present disclosure are not limited to a folded digit line architecture such as that shown in FIG. 2.

The sense amplifier 206 can, in conjunction with the compute component 231, be operated to perform various operations using data from an array as input. In a number of embodiments, the result of an operation can be stored back to the array without transferring the data via a digit line address access (e.g., without firing a column decode signal such that data is transferred to circuitry external from the array and sensing circuitry via local I/O lines). As such, a number of embodiments of the present disclosure can enable performing operations and compute functions associated therewith using less power than various previous approaches. Additionally, since a number of embodiments eliminate the need to transfer data across local and global I/O lines in order to perform compute functions (e.g., between memory and discrete processor), a number of embodiments can enable an increased (e.g., faster) processing capability as compared to previous approaches.

The sense amplifier 206 can further include equilibration circuitry 214, which can be configured to equilibrate the digit lines 205-1 (D) and 205-2 (D)_. In this example, the equilibration circuitry 214 comprises a transistor 224 coupled between digit lines 205-1 (D) and 205-2 (D)_. The equilibration circuitry 214 also comprises transistors 225-1 and 225-2 each having a first source/drain region coupled to an equilibration voltage (e.g., VDD/2), where VDD is a supply voltage associated with the array. A second source/drain region of transistor 225-1 can be coupled digit line 205-1 (D), and a second source/drain region of transistor 225-2 can be coupled digit line 205-2 (D)_. Gates of transistors 224, 225-1, and 225-2 can be coupled together, and to an equilibration (EQ) control signal line 226. As such, activating EQ enables the transistors 224, 225-1, and 225-2, which effectively shorts digit lines 205-1 (D) and 205-2 (D)_ together and to the equilibration voltage (e.g., Vcc/2).

Although FIG. 2 shows sense amplifier 206 comprising the equilibration circuitry 214, embodiments are not so limited, and the equilibration circuitry 214 may be implemented discretely from the sense amplifier 206, implemented in a different configuration than that shown in FIG. 2, or not implemented at all.

As described further below, in a number of embodiments, the sensing circuitry 250 (e.g., sense amplifier 206 and compute component 231) can be operated to perform a selected operation and initially store the result in one of the sense amplifier 206 or the compute component 231 without transferring data from the sensing circuitry via a local or global I/O line (e.g., without performing a sense line address access via activation of a column decode signal, for instance).

Performance of various types of operations can be implemented. For example, Boolean operations (e.g., Boolean logical functions involving data values) are used in many higher level applications. Consequently, speed and power efficiencies that can be realized with improved performance of the operations may provide improved speed and/or power efficiencies for these applications.

As shown in FIG. 2, the compute component 231 can also comprise a latch, which can be referred to herein as a secondary latch 264. The secondary latch 264 can be configured and operated in a manner similar to that described above with respect to the primary latch 215, with the exception that the pair of cross coupled p-channel transistors (e.g., PMOS transistors) included in the secondary latch can have their respective sources coupled to a supply voltage (e.g., VDD), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component 231 is not limited to that shown in FIG. 2, and various other embodiments are feasible.

FIG. 3 is a schematic diagram illustrating circuitry for data movement in a memory device in accordance with a number of embodiments of the present disclosure. FIG. 3 shows eight sense amplifiers (e.g., sense amplifiers 0, 1, . . . , 7 shown at 306-0, 306-1, . . . , 306-7, respectively) each coupled to a respective pair of complementary sense lines (e.g., digit lines 305-1 and 305-2). FIG. 3 also shows eight compute components (e.g., compute components 0, 1, . . . , 7 shown at 331-0, 331-1, . . . , 331-7) each coupled to a respective sense amplifier (e.g., as shown for sense amplifier 0 at 306-0) via respective pass gates 307-1 and 307-2 and digit lines 305-1 and 305-2. For example, the pass gates can be connected as shown in FIG. 2 and can be controlled by an operation selection signal, Pass. An output of the selection logic can be coupled to the gates of the pass gates 307-1 and 307-2 and digit lines 305-1 and 305-2. Corresponding pairs of the sense amplifiers and compute components can contribute to formation of the sensing circuitry indicated at 350-0, 350-1, . . . , 350-7.

Data values present on the pair of complementary digit lines 305-1 and 305-2 can be loaded into the compute component 331-0 as described in connection with FIG. 2. For example, when the pass gates 307-1 and 307-2 are enabled, data values on the pair of complementary digit lines 305-1 and 305-2 can be passed from the sense amplifiers to the compute component (e.g., 306-0 to 331-0). The data values on the pair of complementary digit lines 305-1 and 305-2 can be the data value stored in the sense amplifier 306-0 when the sense amplifier is fired.

The sense amplifiers 306-0, 306-1, . . . , 306-7 in FIG. 3 can each correspond to sense amplifier 206 shown in FIG. 2. The compute components 331-0, 331-1, . . . , 331-7 shown in FIG. 3 can each correspond to compute component 231 shown in FIG. 2. A combination of one sense amplifier with one compute component can contribute to the sensing circuitry (e.g., 350-0, 350-1, . . . , 350-7) of a portion of a DRAM memory subarray 325 configured to couple to an I/O line 355 shared by a number of partitions, as described herein. The paired combinations of the sense amplifiers 306-0, 306-1, . . . , 306-7 and the compute components 331-0, 331-1, . . . , 331-7, shown in FIG. 3, can be included in a sensing component stripe, as shown at 124 in FIG. 1B and at 424 in FIGS. 4A and 4B.

The configurations of embodiments illustrated in FIG. 3 are shown for purposes of clarity and are not limited to these configurations. For instance, the configuration illustrated in FIG. 3 for the sense amplifiers 306-0, 306-1, . . . , 306-7 in combination with the compute components 331-0, 331-1, . . . , 331-7 and the shared I/O line 355 is not limited to half the combination of the sense amplifiers 306-0, 306-1, . . . , 306-7 with the compute components 331-0, 331-1, . . . , 331-7 of the sensing circuitry being formed above the columns 322 of memory cells (not shown) and half being formed below the columns 322 of memory cells. Nor are the number of such combinations of the sense amplifiers with the compute components forming the sensing circuitry configured to couple to a shared I/O line limited to eight. In addition, the configuration of the shared I/O line 355 is not limited to being split into two for separately coupling each of the two sets of complementary digit lines 305-1 and 305-2, nor is the positioning of the shared I/O line 355 limited to being in the middle of the combination of the sense amplifiers and the compute components forming the sensing circuitry (e.g., rather than being at either end of the combination of the sense amplifiers and the compute components).

The circuitry illustrated in FIG. 3 also shows column select circuitry 358-1 and 358-2 that is configured to implement data movement operations with respect to particular columns 322 of a subarray 325, the complementary digit lines 305-1 and 305-2 associated therewith, and the shared I/O line 355 (e.g., as directed by the controller 140 shown in FIGS. 1A-1C). For example, column select circuitry 358-1 has select lines 0, 2, 4, and 6 that are configured to couple with corresponding columns, such as column 0, column 2, column 4, and column 6. Column select circuitry 358-2 has select lines 1, 3, 5, and 7 that are configured to couple with corresponding columns, such as column 1, column 3, column 5, and column 7. The column select circuitry 358 illustrated in connection with FIG. 3 can, in various embodiments, represent at least a portion of the functionality embodied by and contained in the multiplexers 460 illustrated in connection with FIGS. 4A and 4B.

Controller 140 can be coupled to column select circuitry 358 to control select lines (e.g., select line 0) to access data values stored in the sense amplifiers, compute components and/or present on the pair of complementary digit lines (e.g., 305-1 and 305-2 when selection transistors 359-1 and 359-2 are activated via signals from select line 0). Activating the selection transistors 359-1 and 359-2 (e.g., as directed by the controller 140) enables coupling of sense amplifier 306-0, compute component 331-0, and/or complementary digit lines 305-1 and 305-2 of column 0 (322-0) to move data values on digit line 0 and digit line 0\* to shared I/O line 355.

For example, the moved data values may be data values from a particular row 319 stored (cached) in sense amplifier 306-0 and/or compute component 331-0. Data values from each of columns 0 through 7 can similarly be selected by controller 140 activating the appropriate selection transistors.

Moreover, enabling (e.g., activating) the selection transistors (e.g., selection transistors 359-1 and 359-2) can enable a particular sense amplifier and/or compute component (e.g., 306-0 and/or 331-0, respectively) to be coupled with a shared I/O line 355 such that data values stored by an amplifier and/or compute component can be moved to (e.g., placed on and/or transferred to) the shared I/O line 355. In some embodiments, one column at a time is selected (e.g., column 322-0) to be coupled to a particular shared I/O line 355 to move (e.g., transfer and/or transport) the stored data values. In the example configuration of FIG. 3, the shared I/O line 355 is illustrated as a shared, differential I/O line pair (e.g., shared I/O line and shared I/O line*). Hence, selection of column 0 (322-0) could yield two data values (e.g., two bits with values of 0 and/or 1) from a row (e.g., row 319) and/or as stored in the sense amplifier and/or compute component associated with complementary digit lines 305-1 and 305-2. These data values could be input in parallel to each shared, differential I/O pair (e.g., shared I/O and shared I/O*) of the shared differential I/O line 355.

As described herein, a memory device (e.g., 120 in FIG. 1A) can be configured to couple to a host (e.g., 110) via a data bus (e.g., 156) and a control bus (e.g., 154). A bank 121 in the memory device (e.g., bank section 123 in FIG. 1B) can include a plurality of subarrays (e.g., 125-0, 125-1, . . . , 125-N-1 in FIGS. 1B and 1C) of memory cells. The bank 121 can include sensing circuitry (e.g., 150 in FIG. 1A and corresponding reference numbers in FIGS. 2, 3, 4A and 4B) coupled to the plurality of subarrays via a plurality of columns (e.g., 122 in FIG. 1B) of the memory cells. The sensing circuitry can include a sense amplifier and a compute component (e.g., 206 and 231, respectively, in FIG. 2) coupled to each of the columns.

The bank 121 can include a plurality of partitions (e.g., 128-0, 128-1, . . . , 128-M-1 in FIG. 1C) each including a respective subset of the plurality of the subarrays. A controller (e.g., 140 in FIGS. 1A-1C) coupled to the bank can be configured to direct a first data movement from a first subarray to a second subarray in a first partition (e.g., from subarray 125-0 to subarray 125-1 in partition 128-0 in FIG. 1C) in parallel with a second data movement from a first subarray to a second subarray in a second partition (e.g., from subarray 125-4 to subarray 125-5 (not shown) in partition 128-1 in FIG. 1C).

In various embodiments, the memory device 120 can include isolation circuitry (e.g., isolation stripes 172 in FIGS. 1B and 1C and/or isolation stripe 372 and isolation transistors 332 and 333 in FIG. 3) configured to disconnect a first portion of a shared I/O line 355 corresponding to a first partition from a second portion of the same shared I/O line 355 corresponding to a second partition. The controller 140 can be configured to direct the isolation circuitry to disconnect the first portion and the second portion of the shared I/O line 355 during parallel movement (e.g., transfer and/or transport) of data values within the first partition and within the second partition. Disconnecting portions of the shared I/O line 355 can isolate the movement of data values within a first partition from the parallel movement of data values within a second partition.

In various embodiments, the sensing circuitry (e.g., 150 in FIG. 1A and corresponding reference numbers in FIGS. 2, 3, 4A and 4B) of a first subarray can be coupled to the sensing circuitry of the second subarray within the first partition via the first portion of the shared I/O line 355 and the sensing circuitry of a first subarray within the second partition can be coupled to the sensing circuitry of the second subarray via the second portion of the shared I/O line 355. For example, as described in connection with FIGS. 3, 4A and 4B, the sense amplifiers and/or compute components in a sensing component stripe 124 can be selectably coupled via the select circuitry 358 and/or the multiplexers 460. The controller 140 can be configured to direct a movement of a plurality of data values from, for example, a first subarray of a first partition to a plurality of memory cells in a second subarray of the first partition in parallel with a movement of a plurality of data values from a first subarray of a second partition to a plurality of memory cells in a second subarray of the second partition.

In some embodiments, the plurality of subarrays can each be configured to include a same number of a plurality of rows (e.g., 319 in FIG. 3) of memory cells and/or the plurality of partitions can each be configured to include a same number of the plurality of the subarrays in each subset. However, embodiments are not so limited. For example, in various embodiments, the number of rows in at least one subarray and/or the number of subarrays in at least one partition can differ from the other subarrays and/or partitions, depending upon the implementation.

The memory device 120 can include a shared I/O line (e.g., 155 in FIG. 1C) configured to be coupled to the sensing circuitry of the plurality of subarrays, such as to selectably implement parallel movement of a data value from a memory cell in a first subarray to a memory cell in a second subarray. The memory device 120 can, in various embodiments, include a plurality of I/O lines shared by partitions (e.g., 355 in FIGS. 3 and 455-1, 455-2, . . . , 455-M in FIGS. 4A and 4B), such as to selectably implement parallel movement of a plurality of data values from a first to a second subarray (e.g., in the same partition or a different partition). The controller 140 can be configured to move (transfer and/or transport) the data values using the parallel partitioned data movement described herein, in response to a command (e.g., from the host 110), between sequential subarrays in the bank of memory cells using, for example, DRAM logical and/or electrical interfaces. For example, the controller can be configured to use stored instructions for implementation of DRAM logical and/or electrical interfaces.

As described herein, the array of memory cells can include an implementation of DRAM memory cells where the controller is configured, in response to a command to move (e.g., transfer and/or transport) data from the source location to the destination location via a shared I/O line. The source location can be in a first bank and the destination location can be in a second bank in the memory device and/or the source location can be in a first subarray of one bank in the memory device and the destination location can be in a second subarray of the same bank. The first subarray and the second subarray can be in the same partition of the bank or the subarrays can be in different partitions of the bank.

FIG. 3 illustrates schematically an isolation stripe 372 associated with the subarray 325. The subarray 325 can, in some embodiments, be a last subarray in a first direction in a partition (e.g., as shown at subarray 125-3 in partition 128-0 in FIG. 1C). The isolation stripe 372 can include a number of isolation transistors 332 configured to selectably (e.g., as directed by controller 140) connect and disconnect portions of a selected shared I/O line(s) 355. Although FIG. 3 shows one transistor 332, 333 for each of the two illustrated portions of the shared I/O line 355, there can, in some embodiments, be one transistor (e.g., transistor 332) configured to selectably connect and disconnect two portions of a shared I/O line 355. In some embodiments, the isolation stripe 372 can be positioned in association with the sensing component stripe of the last subarray in the partition (e.g., as shown at 172-0 of subarray 128-0 in FIG. 1C).

Each of a plurality of shared I/O lines (e.g., 355 in FIGS. 3 and 455-1, 455-2, . . . , 455-M in FIGS. 4A and 4B) might also be coupled to a respective number of assist amplifiers 361. Each of the number of assist amplifiers 361 can be configured to increase a voltage of a data value moved via the shared I/O line 355 (e.g., to assist in read/write operations, inter-subarray data movements, and/or inter-partition data movements). Each of the number of assist amplifiers can be separated by a number (e.g., a plurality) of subarrays along the shared I/O line 355. The assist amplifiers 361 can, in some embodiments, be spaced with a particular number of subarrays between the assist amplifiers, although embodiments are not so limited. For example, the assist amplifiers can be spaced with a variable number of subarrays between them, depending upon the implementation. The number of assist amplifiers 361 can, in some embodiments, be associated with the isolation circuitry (e.g., transistors 332 and 333) in an isolation stripe 372 between adjacent partitions.

FIGS. 4A and 4B represent another schematic diagram illustrating circuitry for data movement in a memory device in accordance with a number of embodiments of the present disclosure. As illustrated in FIGS. 1B and 1C and shown in more detail in FIGS. 4A and 4B, a bank section of a DRAM memory device can include a plurality of subarrays, which are indicated in FIGS. 4A and 4B at 425-0 as subarray 0 and at 425-N-1 as subarray N-1.

FIGS. 4A and 4B, which are to be considered as horizontally connected, illustrate that each subarray (e.g., subarray 425-0 partly shown in FIG. 4A and partly shown in FIG. 4B) can have a number of associated sense amplifiers 406-0, 406-1, . . . , 406-X-1 and compute components 431-0, 431-1, . . . , 431-X-1. For example, each subarray, 425-0, . . . , 425-N-1, can have one or more associated sensing component stripes (e.g., 124-0, . . . , 124-N-1 in FIG. 1B). According to embodiments described herein, each subarray, 425-0, . . . , 425-N-1, can be split into portions 462-1 (shown in FIG. 4A), 462-2, . . . , 462-M (shown in FIG. 4B). The portions 462-1, . . . , 462-M may each respectively include a particular number (e.g., 2, 4, 8, 16, etc.) of the sense amplifiers and compute components (e.g., sensing circuitry 150), along with the corresponding columns (e.g., 422-0, 422-1, . . . , 422-7) among columns 422-0, . . . , 422-X-1 that can be selectably coupled to a given shared I/O line (e.g., 455-M). Corresponding pairs of the sense amplifiers and compute components can contribute to formation of the sensing circuitry indicated at 450-0, 450-1, . . . , 450-X-1 in FIGS. 4A and 4B.

In some embodiments, as shown in FIGS. 3, 4A, and 4B, the particular number of the sense amplifiers and compute components, along with the corresponding columns, that can be selectably coupled to a shared I/O line 455 (which may be a pair of shared differential lines) can be eight. The number of portions 462-1, 462-2, . . . , 462-M of the subarray can be the same as the number of shared I/O lines 455-1, 455, 2, . . . , 455-M that can be coupled to the subarray. The subarrays can be arranged according to various DRAM architectures for coupling shared I/O lines 455-1, 455, 2, . . . , 455-M between subarrays 425-0, 425-1, . . . , 425-N-1.

For example, portion 462-1 of subarray 0 (425-0) in FIG. 4A can correspond to the portion of the subarray illustrated in FIG. 3. As such, sense amplifier 0 (406-0) and compute component 0 (431-0) can be coupled to column 422-0. As described herein, a column can be configured to include a pair of complementary digit lines referred to as digit line 0 and digit line 0*. However, alternative embodiments can include a single digit line 405-0 (sense line) for a single column of memory cells. Embodiments are not so limited.

As illustrated in FIGS. 1B and 1C and shown in more detail in FIGS. 4A and 4B, a sensing component stripe can, in various embodiments, extend from one end of a subarray to an opposite end of the subarray. For example, as shown for subarray 0 (425-0), sensing component stripe 0 (424-0), which is shown schematically above and below the DRAM columns in a folded sense line architecture, can include and extend from sense amplifier 0 (406-0) and compute component 0 (431-0) in portion 462-1 to sense amplifier X-1 (406-X-1) and compute component X-1 (431-X-1) in portion 462-M of subarray 0 (425-0).

As described in connection with FIG. 3, the configuration illustrated in FIGS. 4A and 4B for the sense amplifiers 406-0, 406-1, . . . , 406-X-1 in combination with the compute components 431-0, 431-1, . . . , 431-X-1 and shared I/O line 0 (455-1) through shared I/O line M-1 (455-M) is not limited to half the combination of the sense amplifiers with the compute components of the sensing circuitry (450) being formed above the columns of memory cells and half being formed below the columns of memory cells 422-0, 422-1, . . . , 422-X-1 in a folded DRAM architecture. For example, in various embodiments, a sensing component stripe 424 for a particular subarray 425 can be formed with any number of the sense amplifiers and compute components of the sensing component stripe being formed above and/or below the columns of memory cells. Accordingly, in some embodiments as illustrated in FIGS. 1B and 1C, all of the sense amplifiers and compute components of the sensing circuitry and corresponding sensing component stripes can be formed above or below the columns of memory cells.

As described in connection with FIG. 3, each subarray can have column select circuitry (e.g., 358) that is configured to implement data movement operations with respect to particular columns 422 of a subarray, such as subarray 425-0, and the complementary digit lines thereof, coupling stored data values from the sense amplifiers 406 and/or compute components 431 to given shared I/O lines 455-1, . . . , 455-M (e.g., complementary shared I/O lines 355 in FIG. 3). For example, the controller 140 can direct that data values of memory cells in a particular row (e.g., row 319) of subarray 425-0 be sensed and moved to a same or different numbered row of one or more subarrays 425-1, 425-2, . . . , 425-N-1 in a same or different numbered column. For example, in some embodiments, the data values can be moved from a portion of a first subarray to a different portion of a second subarray (e.g., not necessarily from portion 462-1 of subarray 0 to portion 462-1 of subarray N-1). In some embodiments data values may be moved from a column in portion 462-1 to a column in portion 462-M using shifting techniques.

The column select circuitry (e.g., 358 in FIG. 3) can direct movement (e.g., sequential movement) for each of the eight columns (e.g., digit/digit*) in the portion of the subarray (e.g., portion 462-1 of subarray 425-0) such that the sense amplifiers and compute components of the sensing component stripe (e.g., 424-0) for that portion can store (cache) and move all data values to the shared I/O line in a particular order (e.g., in an order in which the columns were sensed). With complementary digit lines, digit/digit*, and complementary shared I/O lines 355, for each of eight columns, there can be 16 data values (e.g., bits) sequenced to the shared I/O line from one portion of the subarray such that one data value (e.g., bit) is input to each of the complementary shared I/O lines at a time from each of the sense amplifiers and/or compute components.

As such, with 2048 portions of subarrays each having eight columns (e.g., subarray portion 462-1 of each of subarrays 425-0, 425-1, . . . , 425-N–1), and each configured to couple to a different shared I/O line (e.g., 455-1 through 455-M) 2048 data values (e.g., bits) could be moved to the plurality of shared I/O lines at substantially the same point in time (e.g., in parallel). Accordingly, the plurality of shared I/O lines might be, for example, at least a thousand bits wide (e.g., 2048 bits wide), such as to increase the speed, rate, and/or efficiency of data movement in a DRAM implementation (e.g., relative to a 64 bit wide data path).

As illustrated in FIGS. 4A and 4B, in each subarray (e.g., subarray 425-0) one or more multiplexers 460-1 and 460-2 can be coupled to the sense amplifiers and compute components of each portion 462-1, 462-2, . . . , 462-M of the sensing component stripe 424-0 for the subarray. The multiplexers 460 illustrated in connection with FIGS. 4A and 4B can, in various embodiments, be inclusive of at least the functionality embodied by and contained in the column select circuitry 358 illustrated in connection with FIG. 3. The multiplexers 460-1 and 460-2 can be configured to access, select, receive, coordinate, combine, and move (e.g., transfer and/or transport) the data values (e.g., bits) stored (cached) by the number of selected sense amplifiers and compute components in a portion (e.g., portion 462-1) of the subarray to the shared I/O line (e.g., shared I/O line 455-1). The multiplexers can be formed between the sense amplifiers and compute components and the shared I/O line. As such, a shared I/O line, as described herein, can be configured to couple a source location and a destination location between pairs of bank section subarrays for improved data movement.

As described herein, a controller (e.g., 140) can be coupled to a bank of a memory device (e.g., 121) to execute a command to move data in the bank from a source location (e.g., subarray 425-0) to a destination location (e.g., subarray 425-N–1). A bank section can, in various embodiments, include a plurality of subarrays of memory cells in the bank section (e.g., subarrays 125-0 through 125-N–1 and 425-0 through 425-N–1). The bank section can, in various embodiments, further include sensing circuitry (e.g., 150) coupled to the plurality of subarrays via a plurality of columns (e.g., 322-0, 422-0 and 422-1, of the memory cells). The sensing circuitry can include a sense amplifier and a compute component (e.g., 206 and 231, respectively, in FIG. 2 and at corresponding reference numbers in FIGS. 3, 4A and 4B) coupled to each of the columns and configured to implement the command to move the data.

The bank section can, in various embodiments, further include a shared I/O line (e.g., 155, 355, 455-1 and 455-M) to couple the source location and the destination location to move the data. In addition, the controller can be configured to direct the plurality of subarrays and the sensing circuitry to perform a data write operation on the moved data to the destination location in the bank section (e.g., a selected memory cell in a particular row and/or column of a different selected subarray).

According to various embodiments, the apparatus can include a sensing component stripe (e.g., 124 and 424) including a number of sense amplifiers and compute components that corresponds to a number of columns of the memory cells (e.g., where each column of memory cells is configured to couple to a sense amplifier and/or a compute component). The number of sensing component stripes in the bank section (e.g., 424-0 through 424-N–1) can correspond to a number of subarrays in the bank section (e.g., 425-0 through 425-N–1).

The number of sense amplifiers and compute components can be selectably (e.g., sequentially) coupled to the shared I/O line (e.g., as shown by column select circuitry at 358-1, 358-2, 359-1, and 359-2 in FIG. 3). The column select circuitry can be configured to selectably couple a shared I/O line to, for example, one or more of eight sense amplifiers and compute components in the source location (e.g., as shown in subarray 325 in FIG. 3 and subarray portions 462-1 through 462-M in FIGS. 4A and 4B). As such, the eight sense amplifiers and compute components in the source location can be sequentially coupled to the shared I/O line. According to some embodiments, a number of shared I/O lines formed in the array can correspond to a division of a number of columns in the array by the eight sense amplifiers and compute components that can be selectably coupled to each of the shared I/O lines. For example, when there are 16,384 columns in the array (e.g., bank section), or in each subarray thereof, and one sense amplifier and compute component per column, 16,384 columns divided by eight yields 2048 shared I/O lines.

According to some embodiments, a source sensing component stripe (e.g., 124 and 424) can include a number of sense amplifiers and/or compute components that can be selected and configured to move (e.g., transfer and/or transport) data values (e.g., a number of bits) sensed from a row of the source location in parallel to a plurality of shared I/O lines. For example, in response to commands for sequential sensing through the column select circuitry, the data values stored in memory cells of selected columns of a row of the subarray can be sensed by and stored (cached) in the sense amplifiers and/or compute components of the sensing component stripe until a number of data values (e.g., the number of bits) reaches the number of data values stored in the row and/or a threshold (e.g., the number of sense amplifiers and/or compute components in the sensing component stripe) and then move (e.g., transfer and/or transport) the data values via the plurality of shared I/O lines. In some embodiments, the threshold amount of data can correspond to the at least a thousand bit width of the plurality of shared I/O lines.

Alternatively or in addition, data values may be moved from a secondary latch of a first compute component associated with a row in a subarray (e.g., via a particular sensing component stripe) to a secondary latch in a second compute component associated with the same row, or vice versa. Movement between the secondary latches of the compute components may, in some embodiments, involve use of respective coupled sense amplifiers and/or primary latches. In various embodiments, the data values may be moved between secondary latches for storage in the same row as the source location and/or for storage in different destination locations (e.g., rows) of the same subarray, a number of (e.g., one or more) different subarrays, the same partition, and/or a number of different partitions.

The controller can, as described herein, be configured to move the data values from a selected row and a selected column in the source location to a selected row and a selected column in the destination location via the shared I/O line. In various embodiments, the data values can be moved in response to commands by the controller 140 coupled to a particular subarray 125-0, 125-1, . . . , 125-N−1 and/or a particular sensing component stripe 124-0, 124-1, . . . , 124-N−1 of the subarray. The data values in a particular row of a source (e.g., first) subarray may be moved to a particular row of a destination (e.g., second) subarray. In some embodiments, data values from other rows in the source and/or destination subarrays may remain unmoved. In various embodiments, each subarray may include 256, 512, 1024 rows, among other numbers or rows. For example, the data values may, in some embodiments, be sequentially moved from a first row of the source subarray to a respective first row of the destination subarray, then moved from a second row of the source subarray to a respective second row of the destination subarray, followed by movement from a third row of the source subarray to a respective third row of the destination subarray, and so on until the last row of the subarrays. As described herein, the respective subarrays can be in the same partition or in different partitions. The data values of any number of rows may be moved from a source subarray to a destination subarray. For example, a selection may be made to move the data values of one row through all rows in the source subarray to another one row through all rows at any locations in the destination subarray.

According to various embodiments, a selected row and a selected column in the source location (e.g., a first subarray) input to the controller can be different from a selected row and a selected line in the destination location (e.g., a second subarray). As such, a location of the data in memory cells of the selected row and the selected column in the source subarray can be different from a location of the data moved to memory cells of the selected row and the selected column in the destination subarray. For example, the source location may be a particular row and digit lines of portion 462-1 of subarray 425-0 in FIG. 4A and the destination may be a different row and digit lines of portion 462-M in subarray 425-N−1 in FIG. 4B.

As described herein, a destination sensing component stripe (e.g., 124 and 424) can be the same as a source sensing component stripe. For example, a plurality of sense amplifiers and/or compute components can be selected and configured (e.g., depending on the command from the controller) to selectably move (e.g., transfer and/or transport) sensed data to the coupled shared I/O line and selectably receive the data from one of a plurality of coupled shared I/O lines (e.g., to be moved to the destination location). Selection of sense amplifiers and compute components in the destination sensing component stripe can be performed using the column select circuitry (e.g., 358-1, 358-2, 359-1, and 359-2 in FIG. 3) and/or the multiplexers described herein (e.g., 460-1 and 460-2 in FIGS. 4A and 4B).

The controller can, according to some embodiments, be configured to write an amount of data (e.g., a number of data bits) selectably received by the plurality of selected sense amplifiers and/or compute components in the destination sensing component stripe to a selected row and columns of the destination location in the destination subarray. In some embodiments, the amount of data to write corresponds to the at least a thousand bit width of a plurality of shared I/O lines.

The destination sensing component stripe can, according to some embodiments, include a plurality of selected sense amplifiers and compute components configured to store received data values (e.g., bits) when an amount of received data values (e.g., the number of data bits) exceeds the at least a thousand bit width of the plurality of shared I/O lines. The controller can, according to some embodiments, be configured to write the stored data values (e.g., the number of data bits) to a selected row and columns in the destination location as a plurality of subsets. In some embodiments, the amount of data values of at least a first subset of the written data can correspond to the at least a thousand bit width of the plurality of shared I/O lines. According to some embodiments, the controller can be configured to write the stored data values (e.g., the number of data bits) to the selected row and columns in the destination location as a single set (e.g., not as subsets of data values).

As described herein, a controller (e.g., 140) can be coupled to a bank (e.g., 121) of a memory device (e.g., 120) to execute a command for parallel partitioned data movement in the bank. A bank in the memory device can include a plurality of partitions (e.g., 128-0, 128-1, . . . , 128-M−1 in FIG. 1C) each including a respective plurality of subarrays (e.g., 125-0, 125-1, . . . , 125-N−1 as shown in FIGS. 1B and 1C and 425-0, 425-1, . . . , 425-N−1 as shown in FIGS. 4A and 4B).

The bank can include sensing circuitry (e.g., 150 in FIG. 1A and 250 in FIG. 2) on pitch with the plurality of subarrays and coupled to the plurality of subarrays via a plurality of sense lines (e.g., 205-1 and 205-2 in FIG. 2, 305-1 and 305-2 and at corresponding reference numbers in FIGS. 3, 4A and 4B). The sensing circuitry can, in some embodiments, include a sense amplifier and a compute component (e.g., 206 and 231, respectively, in FIG. 2 and at corresponding reference numbers in FIGS. 3, 4A and 4B) can be coupled to a sense line.

The bank also can include a plurality of shared I/O lines (e.g., 355 in FIGS. 3 and 455-1, 455-2, . . . , 455-M in FIGS. 4A and 4B) configured to be coupled to the sensing circuitry of the plurality of subarrays to selectably implement movement of a plurality of data values between subarrays (e.g., subarray 125-3 in FIG. 1C) of a first partition (e.g., partition 128-0 in FIG. 1C) in parallel with movement of a plurality of data values between subarrays (e.g., subarray 125-4) of a second partition (e.g., partition 128-1). Isolation circuitry (e.g., isolation stripes 172 in FIGS. 1B and 1C and/or isolation stripe 372 and isolation transistors 332 and 333 in FIG. 3) can be configured to selectably connect or disconnect portions of an I/O line(s) shared by the first and second partitions.

The controller can be configured to selectably direct the isolation circuitry to disconnect portions of the plurality of shared I/O lines corresponding to the first and second partitions. Disconnecting the portions may, for example, allow a first data movement (e.g., from a first subarray to a second subarray in a first partition) to be isolated from a parallel second data movement (e.g., from a first subarray to a second subarray in a second partition). The controller also can be configured to selectably direct the isolation circuitry to connect portions of the plurality of shared I/O lines corresponding to the first and second partitions. Connecting the portions may, for example, enable data movement from a subarray in the first partition to a subarray in the second partition.

The controller can be configured to selectably direct the isolation circuitry to connect portions of the plurality of shared I/O lines corresponding to a third partition (not shown) and a fourth partition (e.g., partition 128-M−1 in FIG. 1C). Connecting the portions corresponding to the third and fourth partitions as such can enable a parallel data movement from a subarray in the third partition to a subarray in fourth partition in parallel with a data movement from a subarray in the first partition to a subarray in the second partition, as just described. The controller also can be configured to selectably direct the isolation circuitry to disconnect the portions of a plurality of shared I/O lines corresponding to the second and third partitions. Disconnecting the second partition from the third partition as such can isolate the data movement from the first partition to the second partition from the parallel data movement from the third partition to the fourth partition.

A row can be selected (e.g., opened by the controller and/or subarray controller via an appropriate select line) for the first sensing component stripe and the data values of the memory cells in the row can be sensed. After sensing, the first sensing component stripe can be coupled to the shared I/O line, along with coupling the second sensing component stripe to the same shared I/O line. The second sensing component stripe can still be in a pre-charge state (e.g., ready to accept data). After the data from the first sensing component stripe has been moved (e.g., driven) into the second sensing component stripe, the second sensing component stripe can fire (e.g., latch) to store the data into respective sense amplifiers and compute components. A row coupled to the second sensing component stripe can be opened (e.g., after latching the data) and the data that resides in the sense amplifiers and compute components can be written into the destination location of that row.

In some embodiments, 2048 shared I/O lines can be configured as a 2048 bit wide shared I/O line. According to some embodiments, a number of cycles for moving the data from a first row in the source location to a second row in the destination location can be determined by dividing a number of columns in the array intersected by a row of memory cells in the array by the 2048 bit width of the plurality of shared I/O lines. For example, an array (e.g., a bank, a bank section, or a subarray thereof) can have 16,384 columns, which can correspond to 16,384 data values in a row, which when divided by the 2048 bit width of the plurality of shared I/O lines intersecting the row can yield eight cycles. Within each separate cycle, 2048 data values can be moved at substantially the same point in time (e.g., in parallel one data value per each of the plurality of shared I/O lines at a time) for movement of all the data in the row after completion of the eight cycles. Alternatively or in addition, a bandwidth for moving the data from a first row in the source location to a second row in the destination location can be determined by dividing the number of columns in the array intersected by the row of memory cells in the array by the 2048 bit width of the plurality of shared I/O lines and multiplying the result by a clock rate of the controller. In some embodiments, determining a number of data values in a row of the array can be based upon the plurality of sense (digit) lines in the array.

According to some embodiments, the source location in the first subarray and the destination location in the second subarray can be in a single bank section of a memory device (e.g., as shown in FIGS. 1B-1C and FIGS. 4A-4B). Alternatively or in addition, the source location in the first subarray and the destination location in the second subarray can be in separate banks and bank sections of the memory device coupled to a plurality of shared I/O lines. As such, the data values can be moved (e.g., in parallel) from the first sensing component stripe for the first subarray via the plurality of shared I/O lines to the second sensing component stripe for the second subarray.

According to various embodiments, the controller 140 can select (e.g., open via an appropriate select line) a first row of memory cells, which corresponds to the source location, for the first sensing component stripe to sense data stored therein, couple the plurality of shared I/O lines to the first sensing component stripe, and couple the second sensing component stripe to the plurality of shared I/O lines (e.g., via the column select circuitry 358-1, 358-2, 359-1, and 359-2 and/or the multiplexers 460-1 and 460-2). As such, the data values can be moved in parallel from the first sensing component stripe to the second sensing component stripe via the plurality of shared I/O lines. The first sensing component stripe can store (e.g., cache) the sensed data and the second sensing component stripe can store (e.g., cache) the moved data.

The controller can select (e.g., open via an appropriate select line) a second row of memory cells, which corresponds to the destination location, for the second sensing component stripe (e.g., via the column select circuitry 358-1, 358-2, 359-1, and 359-2 and/or the multiplexers 460-1 and 460-2). The controller can then direct writing the data moved to the second sensing component stripe to the destination location in the second row of memory cells.

The shared I/O line can be shared between all sensing component stripes. In various embodiments, one sensing component stripe or one pair of sensing component stripes (e.g., coupling a source location and a destination location) can communicate with the shared I/O line at any given time. As described herein, a source row of a source subarray (e.g., any one of 512 rows) can be different from (e.g., need not match) a destination row of a destination subarray, where the source and destination subarrays can, in various embodiments, be in the same or different banks and bank sections of memory cells. Moreover, a selected source column (e.g., any one of eight configured to be coupled to a particular shared I/O line) can be different from (e.g., need not match) a selected destination column of a destination subarray.

Although the description herein has referred to four partitions for purposes of clarity, the apparatuses and methods presented herein can be adapted to any number of portions of the shared I/O lines, partitions, subarrays, and/or rows therein. For example, the controller can send signals to direct connection and disconnection via the isolation circuitry of respective portions of the shared I/O lines from a first subarray in a bank to a last subarray in the bank to enable data movement from a subarray in any partition to a subarray in any other partition (e.g., the partitions can be adjacent and/or separated by a number of other partitions). In addition, although two disconnected portions of the shared I/O lines were described to enable parallel data movement within two respective paired partitions, the controller can send signals to direct connection and disconnection via the isolation circuitry of any number of portions of the shared I/O lines to enable parallel data movement within any number of respective paired partitions. Moreover, the data can be selectably moved in parallel in the respective portions of the shared I/O lines in either of the first direction and/or the second direction.

While example embodiments including various combinations and configurations of sensing circuitry, sense amplifiers, compute components, sensing component stripes, shared I/O lines, column select circuitry, multiplexers, isolation stripes, assist amplifiers, etc., have been illustrated and described herein, embodiments of the present disclosure are not limited to those combinations explicitly recited herein. Other combinations and configurations of the sensing circuitry, sense amplifiers, compute components, sensing component stripes, shared I/O lines, column select circuitry, multiplexers, isolation stripes, assist amplifiers, etc., disclosed herein are expressly included within the scope of this disclosure.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and processes are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
    a memory device, comprising:
        a first partition and a second partition, wherein each of the partitions comprises a respective subarray of memory cells;
        an input/output (I/O) line shared by the first and second partitions; and
        a controller configured to:
            selectably couple the I/O line to sensing circuitry coupled to selected columns of a total number of columns of memory cells to move corresponding data values stored by the sensing circuitry to the I/O line;
            direct, via the I/O line, a first data movement within the first partition in parallel with a second data movement within the second partition; and
            control isolation circuitry to disconnect at least a portion of the first partition from at least a portion of the second partition during the parallel first and second data movements.

2. The apparatus of claim 1, wherein the sensing circuitry comprises a sense amplifier.

3. The apparatus of claim 1, wherein the isolation circuitry is configured to selectably disconnect the portion of the first partition from the portion of the second partition.

4. The apparatus of claim 1, wherein the isolation circuitry is configured to selectably disconnect the portion of the first partition from the portion of the second partition by selectable disconnection of portions of the I/O line shared by the first and second partitions.

5. The apparatus of claim 1, wherein the controller is further configured to:
    direct sensing circuitry coupled to a first subarray and sensing circuitry coupled to a second subarray in the first partition to couple to a first portion of the I/O line shared by the first and second subarrays in the first partition;
    direct sensing circuitry coupled to a first subarray and sensing circuitry coupled to a second subarray in the second partition to couple to a second portion of the I/O line shared by the first and second subarrays in the second partition; and
    direct a parallel movement of a plurality of data values from the first subarray to the second subarray in the first partition and from the first subarray to the second subarray in the second partition.

6. A system, comprising:
    a host;
    a memory device configured to receive a command from the host for movement of data, the memory device comprising:
        a first partition and a second partition, wherein each of the partitions comprises a respective subarray of memory cells; and
        an input/output (I/O) line shared by each of the partitions, the I/O line comprising a first portion and a second portion, wherein
        the first portion corresponds to the first partition and the second portion corresponds to the second partition;
        the memory device is configured to direct isolation circuitry to connect the first portion of the I/O line to the second portion of the I/O line; and
        the memory device is further configured to selectably direct the isolation circuitry to disconnect the first portion of the I/O line from the second portion of the I/O line during parallel first and second data movements, wherein the first data movement is within the first partition and the second data movement is within the second partition, and connect the first portion to the second portion during a third data movement, wherein the third data movement is from the first partition to the second partition.

7. The system of claim 6, wherein the memory device is further configured to selectably direct the isolation circuitry to:
    connect a third portion of the I/O line corresponding to a third partition of the memory device to a fourth portion of the I/O line corresponding to a fourth partition of the memory device during a fourth data movement, wherein the fourth data movement is from the third partition to the fourth partition, and each of the third and fourth partitions comprises a respective subarray of memory cells; and
    disconnect the second portion of the I/O line from the third portion of the I/O line during the fourth data movement.

8. The system of claim 7,
    wherein the third and fourth data movements are parallel data movements.

9. The system of claim 6, wherein the memory device further comprises:
    a sensing component stripe configured to include a quantity of sense amplifiers that corresponds to a quantity of columns of the memory cells;
    wherein the quantity of sense amplifiers in the sensing component stripe is selectably coupled to the I/O line.

10. A method for operating a memory device, comprising:
    receiving a command, by the memory device, for parallel movement of data, the memory device comprising:
        a first partition and a second partition, wherein the first partition and the second partition each of the partitions comprises a respective subarray of memory cells; and an input/output (I/O) line shared by each of the partitions, the I/O line comprising a first portion and a second portion; and using isolation circuitry to disconnect the first portion of the I/O line from the second portion of the I/O line;

moving data within the first partition via the disconnected first portion of the I/O line;

in parallel with moving data within the first partition, moving data within the second partition via the disconnected second portion of the I/O line;

using the isolation circuitry to connect the first portion of the I/O line to the second portion of the I/O line; and moving data from the first partition to the second partition via the connected I/O line.

11. The method of claim 10, wherein the method further comprises:

using the isolation circuitry to disconnect the second portion of the I/O line from a third portion of the I/O line;

using the isolation circuitry to connect the third portion of the I/O line to a fourth portion of the I/O line; and in parallel with moving the data from the first partition to the second partition, moving data from a third partition to a fourth partition.

12. The method of claim 10, wherein the method further comprises:

using the isolation circuitry to connect the second portion of the I/O line to a third portion of the I/O line; and moving data from the second partition to the third partition.

13. The method of claim 10, wherein the method further comprises:

using the isolation circuitry to connect together the first portion, the second portion, a third portion, and a fourth portion of the I/O line; and moving data from the second partition to a third partition.

14. The method of claim 10, wherein the method further comprises:

coupling a first isolation transistor of the isolation circuitry to the first portion of the I/O line to selectably control data movement from the first partition to the second partition; and coupling a second isolation transistor of the isolation circuitry to the second portion of the I/O line to selectably control data movement from the second partition to the first partition.

15. The method of claim 10, wherein the method further comprises:

using the isolation circuitry to disconnect the first and second partitions by inactivation of an isolation transistor coupled to the I/O line between the first and second partitions; and forming, by the disconnect, the first portion and the second portion of the I/O line.

16. The method of claim 10, wherein the method further comprises using the isolation circuitry to disconnect the first and second partitions to isolate a first data movement from a first subarray to a second subarray in the first partition from a parallel second data movement from a first subarray to a second subarray in the second partition.

17. The method of claim 16, wherein the method further comprises:

moving first data values stored in a number of rows of each of a number of subarrays in the first data movement;

moving the first data values to a corresponding number of rows in a respective number of adjacent subarrays;

moving second data values stored in a number of rows of each of a number of subarrays in the second data movement; and moving the second data values to a corresponding number of rows in a respective number of adjacent subarrays.

18. The method of claim 10, wherein the method further comprises:

connecting the first and second partitions via activation of an isolation transistor of the isolation circuitry coupled to the I/O line between the first and second partitions; and moving data from a last subarray of the first partition to a first subarray in the second partition.

19. The method of claim 10, wherein the method further comprises:

storing data values from a number of rows of a last subarray of the first partition in a storage space prior to being overwritten by data values from a number of rows in a next-to-last subarray of the first partition; and moving the data values from the storage space to a corresponding number of rows in a first subarray of the second partition.

* * * * *